(12) United States Patent
Rijo et al.

(10) Patent No.: US 12,248,381 B2
(45) Date of Patent: Mar. 11, 2025

(54) DATA RETENTION EVENT PREPARATION/RECOVERY SYSTEM

(71) Applicant: Dell Products L.P., Round Rock, TX (US)

(72) Inventors: Michael Rijo, San Jose, CA (US); Robert Proulx, Holden, MA (US)

(73) Assignee: Dell Products L.P., Round Rock, TX (US)

( * ) Notice: Subject to any disclaimer, the term of this patent is extended or adjusted under 35 U.S.C. 154(b) by 106 days.

(21) Appl. No.: 18/118,216

(22) Filed: Mar. 7, 2023

(65) Prior Publication Data
US 2024/0303167 A1    Sep. 12, 2024

(51) Int. Cl.
| | |
|---|---|
| G06F 11/00 | (2006.01) |
| G06F 11/07 | (2006.01) |
| G06F 11/20 | (2006.01) |
| G11C 16/08 | (2006.01) |
| G11C 16/34 | (2006.01) |

(52) U.S. Cl.
CPC ...... *G06F 11/2094* (2013.01); *G06F 11/0793* (2013.01); *G11C 16/08* (2013.01); *G11C 16/3404* (2013.01)

(58) Field of Classification Search
None
See application file for complete search history.

(56) References Cited

U.S. PATENT DOCUMENTS

| | | | |
|---|---|---|---|
| 8,169,825 B1 | 5/2012 | Shalvi et al. | |
| 2004/0017708 A1* | 1/2004 | Choi | G06F 9/4401 |
| | | | 365/200 |
| 2014/0250348 A1* | 9/2014 | Harari | G11C 29/84 |
| | | | 714/773 |
| 2018/0307496 A1* | 10/2018 | Ke | G06F 1/30 |
| 2021/0012851 A1* | 1/2021 | Huang | G11C 29/886 |
| 2021/0064257 A1* | 3/2021 | Cariello | G11C 16/0483 |

OTHER PUBLICATIONS

Google Scholar/Patents search—text refined (Year: 2024).*

* cited by examiner

*Primary Examiner* — Christopher S McCarthy
(74) *Attorney, Agent, or Firm* — Joseph Mencher

(57) ABSTRACT

A data retention event preparation/recovery system includes a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, identifies a first subset of the plurality of NAND subsystems that exceed an error threshold, identifies at least one overprovisioned block in the plurality of NAND subsystem, copies data that is stored on the first subset of the plurality of NAND subsystems to the at least one overprovisioned block in the plurality of NAND subsystems, and power offs the plurality of NAND subsystems to begin the data retention event.

20 Claims, 23 Drawing Sheets

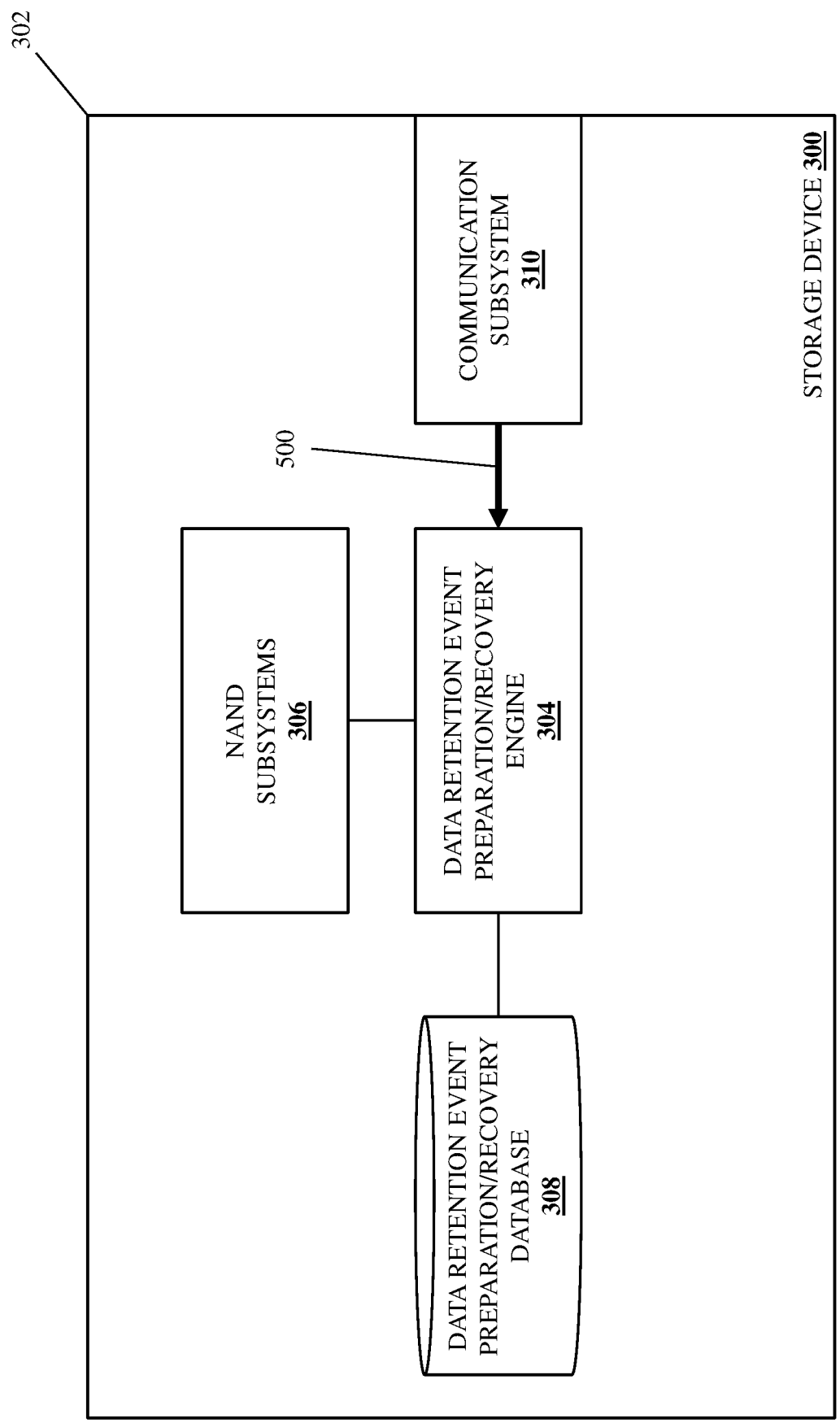

DATA RETENTION EVENT PREPARATION/RECOVERY SYSTEM

BACKGROUND

The present disclosure relates generally to information handling systems, and more particularly to preparing for and recovering from data retention events experienced by storage devices used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system such as, for example, server devices and/or other computing devices known in the art, utilize storage devices such as Solid State Drive (SSD) storage devices for the storage of their data. In many situations, such SSD storage devices spend most of their operating lifetime in a powered-on state, and are configured to periodically perform background operations while in that powered-on state to rewrite or otherwise refresh blocks in their storage subsystems (e.g., as part of garbage collection operations and/or other data/block refresh operations known in the art) in order to reduce data retention effects that occur following the writing of data to the storage subsystem and up to the rewriting of that data within the storage subsystem. As will be appreciated by one of skill in the art in possession of the present disclosure, data retention effects like those discussed above introduce a limiting factor in the operating life of SSD storage devices because they can cause data on its storage subsystems to become unrecoverable at relatively higher endurance levels (e.g., after relatively higher program/erase cycles have been performed on those storage subsystems) and relatively higher data retention levels (e.g., after storage of data for relatively higher time periods in a particular storage subsystem before rewriting that data).

However, users occasionally require storage devices to be powered off for extended periods of time that result in extended data retention effects in order to, for example, relocate a datacenter or SSD device within a datacenter, and many conventional SSD storage devices are configured for extended data retention effects associated with being powered off for 3 months (e.g., as defined in "datasheet requirements"). However, following such extended data retention effects (e.g., powering on after having been powered off for up to 3 months), SSD storage devices may produce higher latency and/or other Quality of Service (QOS) issues until the data stored in the blocks in their storage subsystems is rewritten due to, for example, the need to perform additional error recovery operations to accommodate data in blocks in its storage subsystem that have degraded due to data retention effects prior to the rewriting of that data. Furthermore, in extreme cases, data stored in blocks in the storage subsystems of an SSD storage device may be unrecoverable following such extended data retention effects.

Accordingly, it would be desirable to provide a data retention event system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a data retention event preparation/recovery engine that is configured to determine that a plurality of NAND subsystems will experience a data retention event and, in response: identify a first subset of the plurality of NAND subsystems that exceed an error threshold; identify at least one overprovisioned block in the plurality of NAND subsystems; copy data that is stored on the first subset of the plurality of NAND subsystems to the at least one overprovisioned block in the plurality of NAND subsystems; and power off the plurality of NAND subsystems to begin the data retention event.

BRIEF DESCRIPTION OF THE DRAWINGS

FIG. 5B is a schematic view illustrating an embodiment of the storage device of FIG. 3 operating during the method of FIG. 4.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
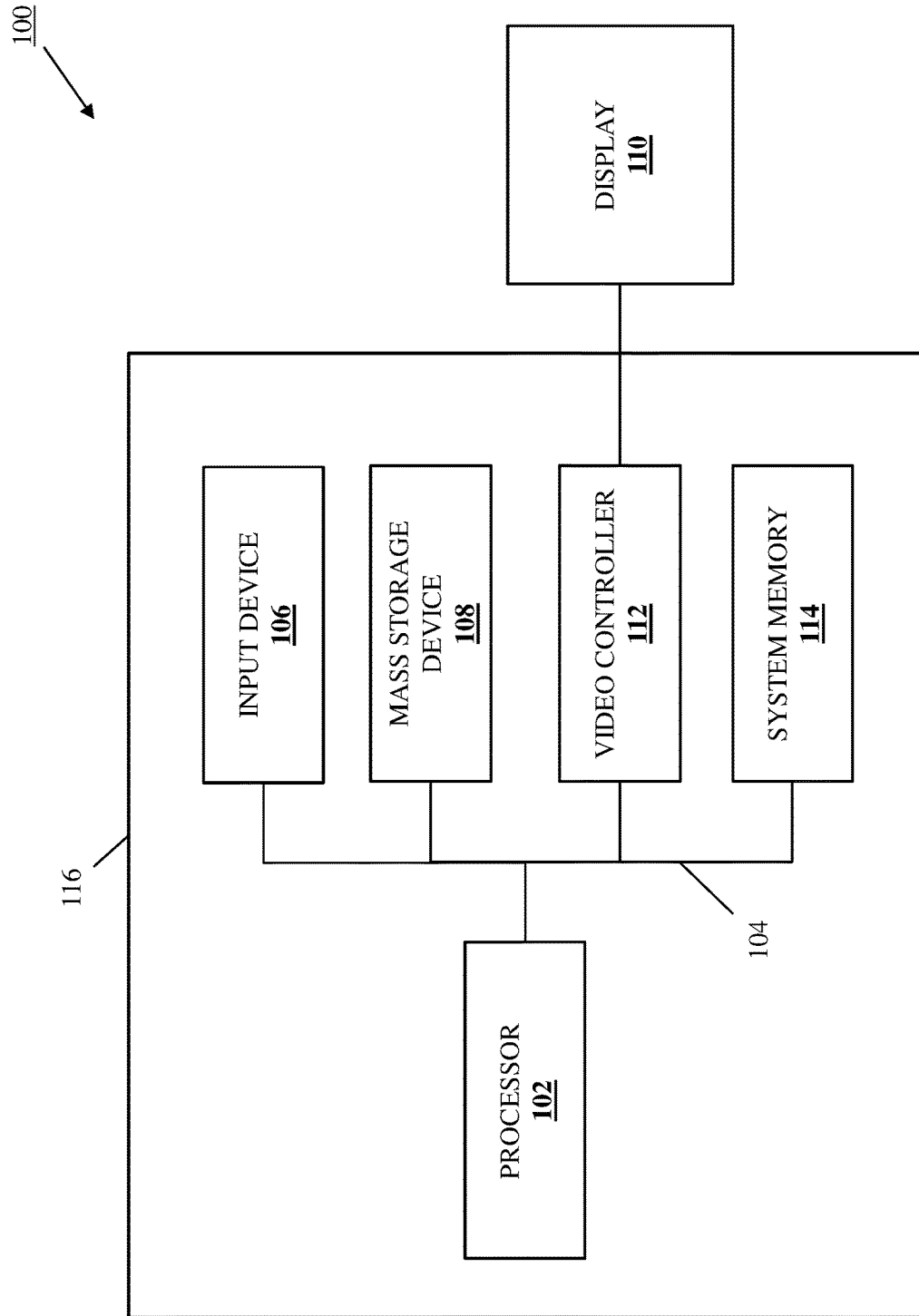
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
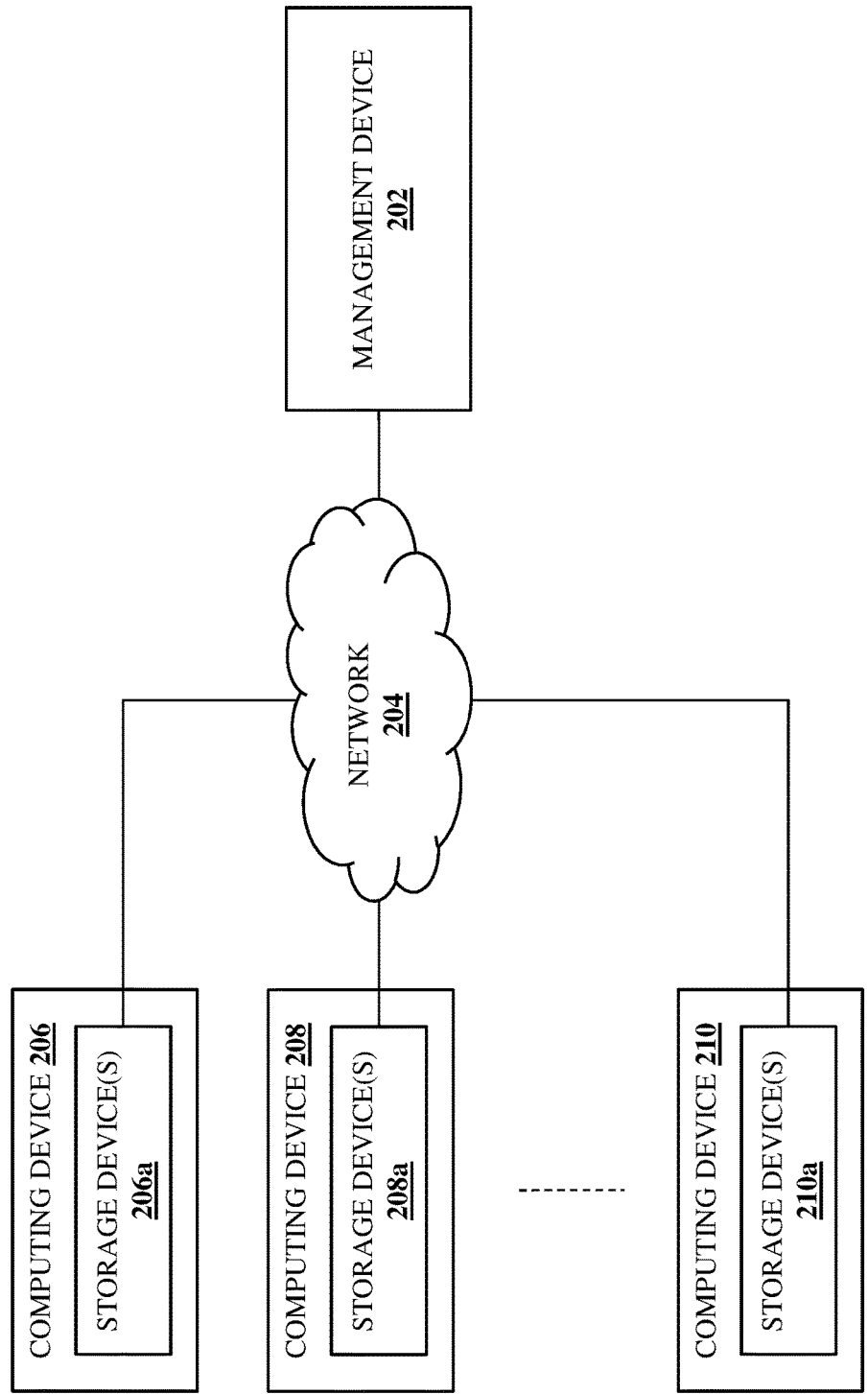
FIG. 2 is a schematic view illustrating an embodiment of a networked system that may include the data retention event preparation/recovery system of the present disclosure.

Referring now to FIG. 2, an embodiment of a networked system 200 is illustrated that may include the data retention event preparation/recovery system of the present disclosure. In the illustrated embodiment, the networked system 200 includes a management device 202. In an embodiment, the management device 202 may be provided by the IHS 100 discussed above with reference to FIG. 1, and/or may include some or all of the components of the IHS 100, and in specific examples may be provided by a desktop computing device, a laptop/notebook computing device, and/or other computing devices that would be apparent to one of skill in the art in possession of the present disclosure. However, while illustrated and discussed as being provided by particular computing devices, one of skill in the art in possession of the present disclosure will recognize that management devices provided in the networked system 200 may include any devices that may be configured to operate similarly as the management device discussed below.

In the illustrated embodiment, the management device 202 is coupled to a network 204 such as a Local Area Network (LAN), the Internet, combinations thereof, and/or any other networks that would be apparent to one of skill in the art in possession of the present disclosure. In addition, a plurality of computing devices 206, 208, and up to 210 are coupled to the management device 202 via the network 204. In an embodiment, any or each of the computing devices 206-210 may be provided by the IHS 100 discussed above with reference to FIG. 1, and/or may include some or all of the components of the IHS 100, and in specific examples may be provided by server devices. However, while illustrated and discussed as being provided by server devices, one of skill in the art in possession of the present disclosure will recognize that computing devices provided in the networked system 200 may include any devices that may be configured to operate similarly as the computing devices 206-210 discussed below.

In an embodiment, each of the computing devices 206-210 includes one or more storage devices, with the computing device 206 including storage device(s) 206a, the computing device 208 including storage device(s) 208a, and up to the computing device 210 including storage device(s) 210a in the example illustrated in FIG. 2. In an embodiment, any or each of the storage devices 206a-210a may be provided by Solid State Drive (SSD) storage devices, although one of skill in the art in possession of the present disclosure will appreciate how other storage devices may benefit from the teachings of the present disclosure and thus may fall within its scope as well. However, while a specific networked system 200 has been illustrated and described, one of skill in the art in possession of the present disclosure will recognize that the data retention event preparation/recovery system of the present disclosure may be provided networked systems including a variety of components and component configurations while remaining within the scope of the present disclosure as well.

Figure 3:
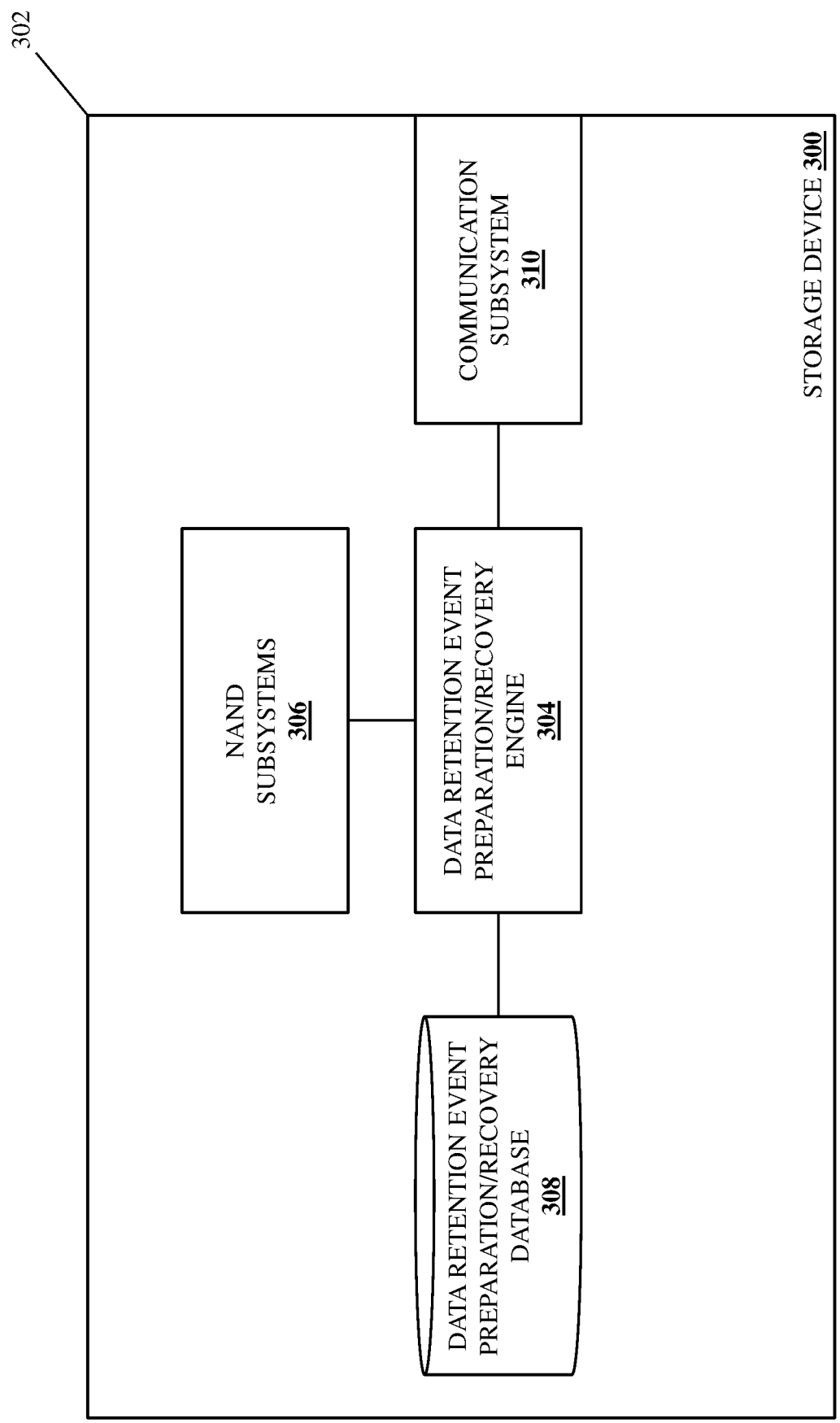
FIG. 3 is a schematic view illustrating an embodiment of a storage device that may be included in the networked system of FIG. 2 and that may provide the data retention event preparation/recovery system of the present disclosure.

Referring now to FIG. 3, an embodiment of a storage device 300 is illustrated that may provide any or each of the storage devices 206a-206c discussed above with reference to FIG. 2. As such, the storage device 300 may be provided by the SSD storage device discussed above. However, while illustrated and discussed as being provided by a particular type of storage device, one of skill in the art in possession of the present disclosure will recognize that the functionality of the storage device 300 discussed below may be provided by other devices that are configured to operate similarly as the storage device 300 discussed below. In the illustrated embodiment, the storage device 300 includes a chassis 302 that houses the components of the storage device 300, only some of which are illustrated and discussed below. For example, the chassis 302 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a data retention event preparation/recovery engine 304 that is configured (e.g., as firmware or other processing capabilities in the storage device 300) to perform the functionality of the data retention event preparation/recovery engines and/or storage devices discussed below.

The chassis 302 may also house a plurality of NAND subsystems 306 that are coupled to the data retention event preparation/recovery engine 304 (e.g., via a coupling to the processing system) and that, as discussed below, may include NAND blocks, NAND wordlines, NAND pages, and/or other NAND storage subsystems that would be apparent to one of skill in the art in possession of the present disclosure. In the illustrated embodiment, the chassis 302 may house a data retention event preparation/recovery database 308 that is configured to store any of the information utilized by the data retention event preparation/recovery engine 304 discussed below, and that may be provided on a memory or storage subsystem (e.g., Dynamic Random Access Memory (DRAM) devices in the storage device 300), on the NAND subsystems 306 (e.g., as metadata stored in the NAND subsystems), and/or in any other manner that would be apparent to one of skill in the art in possession of the present disclosure.

The chassis 302 may also house a communication subsystem 310 that is coupled to the data retention event preparation/recovery engine 304 (e.g., via a coupling between the communication subsystem 310 and the processing system) and that may be provided by any of a variety of storage device communication components that would be apparent to one of skill in the art in possession of the present disclosure. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

In the discussion below, several methods are described for performing different data retention event preparation and recovery functionality in storage devices that may be activated prior to a data retention event (e.g., an extended time period in which the storage device is powered off) and that may operate to prepare the data in the storage device for data retention effects experienced during the data retention event. As will be appreciated by one of skill in the art in possession of the present disclosure, any of the methods, all of the methods, and/or any combination of the methods described below may be performed by a storage device in preparation for a data retention event, and one of skill in the art in possession of the present disclosure will appreciate how any of the details of the methods described below may be modified to conform will the performance of any of the other methods described below while remaining within the scope of the present disclosure as well. Furthermore, one of skill in the art in possession of the present disclosure will appreciate that any (or any combination of) the method(s) to prepare for the data retention event described below may take several hours (with minimal impact on storage device performance in many situations), and thus may be activated by a network administrator or other user with that in mind to optimize or otherwise prepare the NAND subsystems in storage devices for data retention events.

Figure 4:
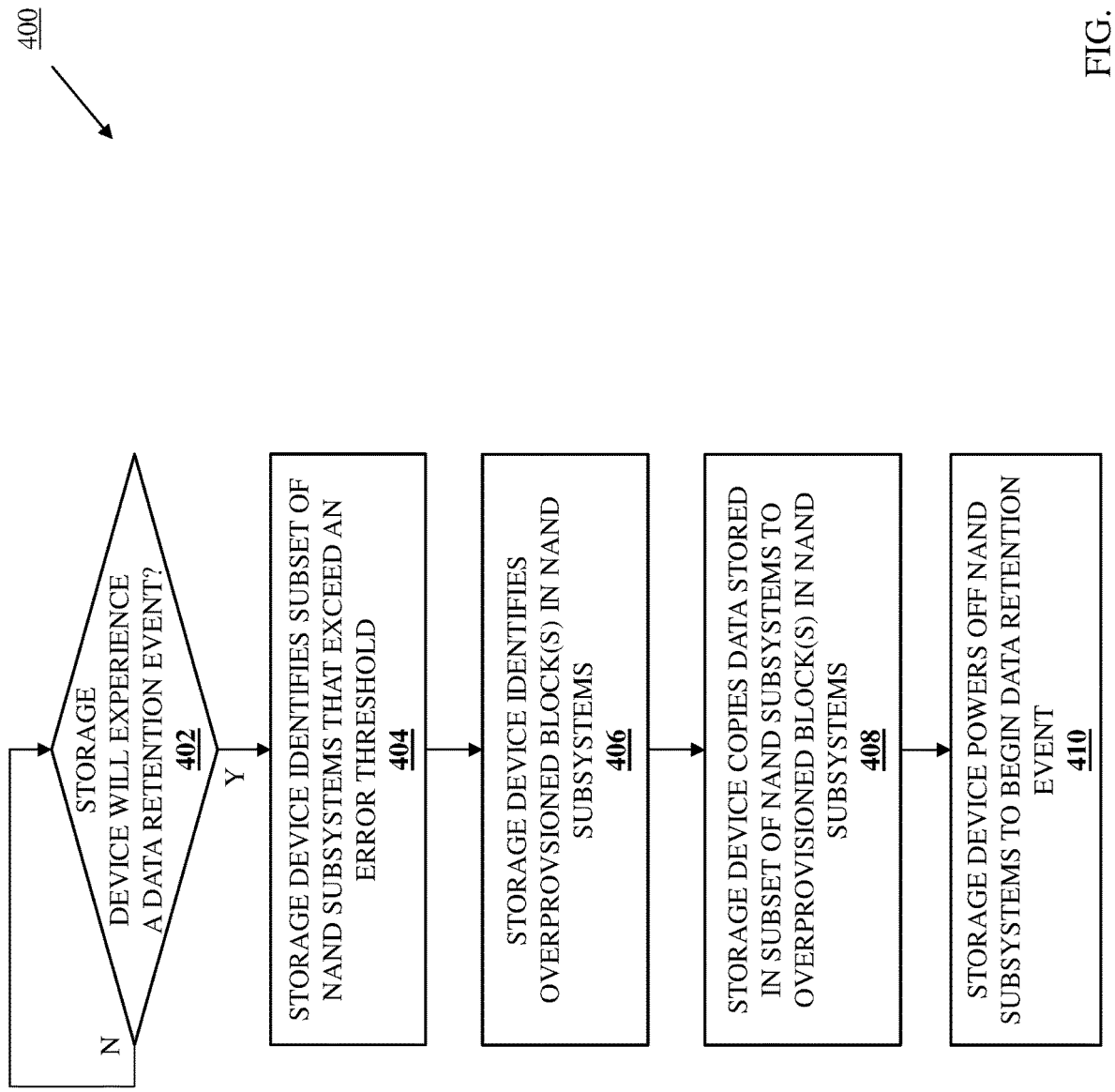
FIG. 4 is a flow chart illustrating an embodiment of a method for preparing for a data retention event in a storage device.

Referring now to FIG. 4, an embodiment of a method 400 for preparing for a data retention event in a storage device is illustrated. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, identifies a first subset of the plurality of NAND subsystems that exceed an error threshold, identifies at least one overprovisioned block in the plurality of NAND subsystem, copies data that is stored on the first subset of the plurality of NAND subsystems to the at least one overprovisioned block in the plurality of NAND subsystems, and power offs the plurality of NAND subsystems to begin the data retention event. As discussed below, the data retention event preparation operations performed during the method 400 allow for the copying of data, which is stored in "problematic" NAND subsystems with relatively high chances of rendering that data unrecoverable following the data retention event, to overprovisioned blocks in the NAND subsystems such that, in the event that data is unrecoverable from the problematic NAND subsystems following the data retention event, it may be accessed from the overprovisioned blocks to which it was copied. As will be appreciated by one of skill in the art in possession of the present disclosure, the powering down of the storage device in a controlled manner may render the keeping of spare blocks ready for incoming traffic or garbage collection operations unnecessary.

The method 400 begins at decision block 402 where it is determined whether a storage device will experience a data retention event. In an embodiment, at decision block 402, the storage device 300 may have previously been powered on and may be operating conventionally to allow/enable the writing of data to the NAND subsystems 306, allow/enable the reading of data from the NAND subsystems 306, allow/enable background operations to be performed on the NAND subsystems 306, and/or perform other conventional powered-on storage device operations that would be apparent to one of skill in the art in possession of the present disclosure. Furthermore, at decision block 402, the data retention event preparation/recovery engine 304 in the storage device 300 may monitor for an instruction from, for example, the management device 202 to prepare for a data retention event in order to determine whether the storage device 300 will experience a data retention event.

As will be appreciated by one of skill in the art in possession of the present disclosure, the data retention events that may be experienced by the storage device 300 as discussed below may be provided by the powering off of the storage device 300 for any extended period of time, and the time periods that qualify as "extended" in order to provide those data retention events will differ depending on the configuration, characteristics, and/or other properties of the storage device 300. However, one of skill in the art in possession of the present disclosure will recognize that the data retention events discussed below may be provided by the powering off of the storage device 300 for any extended time period that results in data retention effects that degrade the data stored thereon such that the data recovery operations discussed below are required for that data. Furthermore, the initiation of the data retention event preparation operations by the storage device 300 via the management device 202 by a network administrator or other user may be performed when that storage device 300 is expected to experience a data retention event (e.g., several hours prior to powering off that storage device in some embodiments), even if that storage device 300 does not end up experiencing that data retention event. As such, the instruction to prepare for the data retention event may be provided to the storage device 300 in a variety of situations that will fall within the scope of the present disclosure.

However, while determinations of whether a storage device will experience a data retention event in response to an instruction from a management device have been described, one of skill in the art in possession of the present disclosure will appreciate how other techniques for determining whether a storage device will experience a data retention event will fall within the scope of the present disclosure as well. If, at decision block 402, it is determined that the storage device will not experience a data retention event, the method 400 returns to decision block 402. As such, the method 400 may loop to determine whether the storage device 300 will experience a data retention event as long as the storage device 300 is powered on and no instruction is received from the management device 202 to prepare for a data retention event.

Figure 5A:
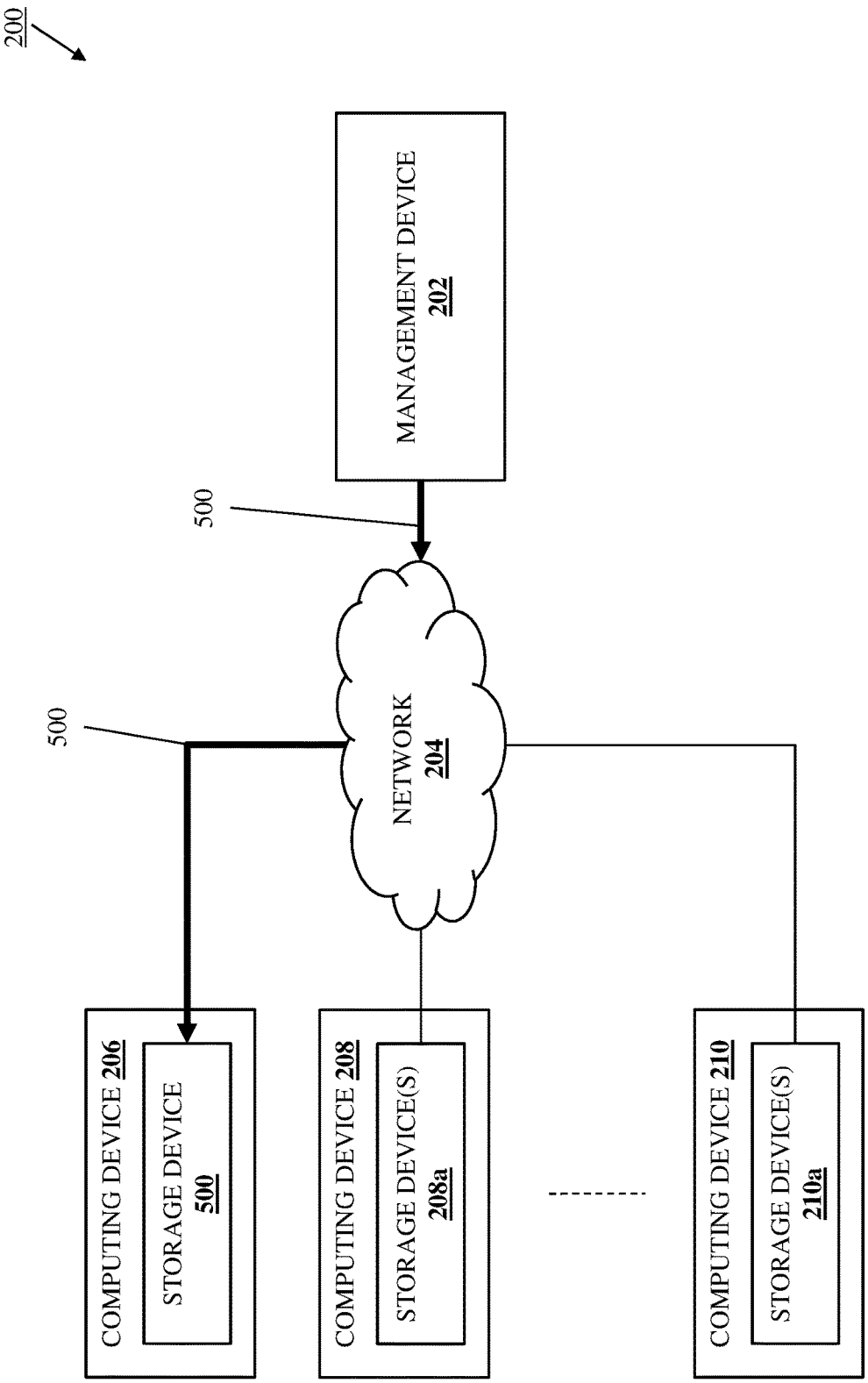
FIG. 5A is a schematic view illustrating an embodiment of the networked system of FIG. 2 operating during the method of FIG. 4.

If, at decision block 402, it is determined that the storage device will experience a data retention event, the method 400 proceeds to block 404 where the storage device identifies a subset of NAND subsystems that exceed an error threshold. With reference to FIGS. 5A and 5B, the management device 202 may perform data retention event preparation instruction operations 500 that may include the management device 202 transmitting a data retention event preparation instruction via the network 204 and to a storage device 500 in the computing device 206 that may be included in one of the storage device(s) 206a discussed above with reference to FIG. 2. As such, at decision block 402, the data retention event preparation/recovery engine 304 in the storage device 300/500 may receive that data retention event preparation instruction via its communication subsystem 310 and determine that the storage device 300 will experience a data retention event.

Figure 6:
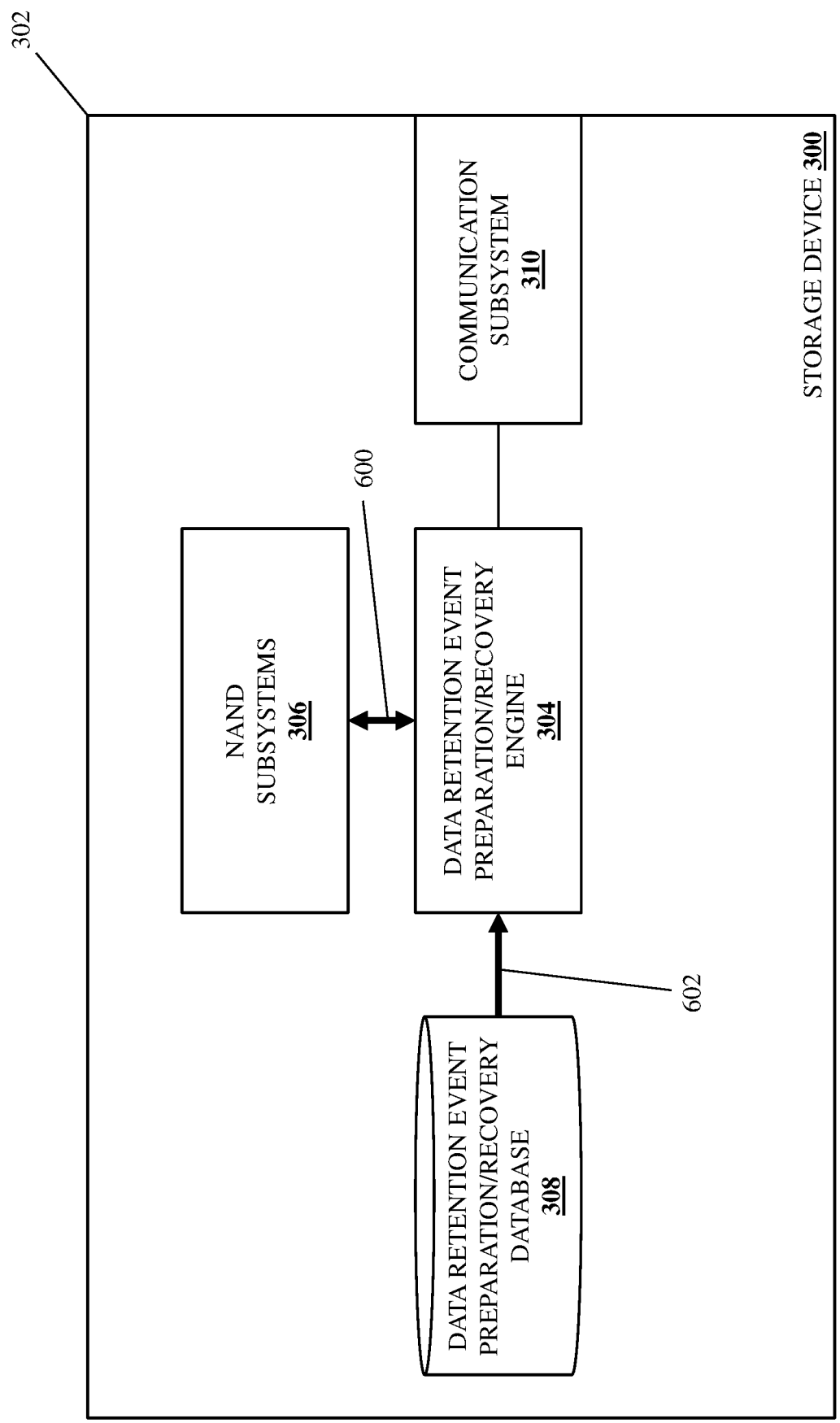
FIG. 6 is a schematic view illustrating an embodiment of the storage device of FIG. 3 operating during the method of FIG. 4.

With reference to FIG. 6, in an embodiment of block 404 and in response to determining that the storage device 300 (and its NAND subsystems 306) will experience the data retention event, the data retention event preparation/recovery engine 304 in the storage device 300 may perform NAND subsystem access operations 600 that may include accessing the NAND subsystems 306 to identify a subset of the NAND subsystems 306 that exceed an error threshold. For example, the error threshold utilized at block 404 may include a threshold bit error rate or other threshold error count in a NAND subsystem that one of skill in the art in possession of the present disclosure will recognize may cause data stored in that NAND subsystem to become unrecoverable following the data retention event. As will be appreciated by one of skill in the art in possession of the present disclosure, such error counts in NAND subsystem may result from defects of other issues in that NAND subsystem, and the threshold error count may be defined based on it resulting in a threshold statistical likelihood of resulting in unrecoverable data in a NAND subsystem.

However, while a specific example of an error threshold has been described, one of skill in the art in possession of the present disclosure will appreciate how other error thresholds associated with NAND subsystems may be used while remaining within the scope of the present disclosure as well. For example, error handling statistics reaching a threshold such as a threshold read retry count or a threshold read retry depth, the identification of pages within physical blocks that are known to have higher error rates, the identification of physical blocks that are known to have higher error rates, the identification of dies having higher retry rates or bad block counts, and/or any other error factors may be utilized at block 404 to identify the subset of NAND subsystems while remaining within the scope of the present disclosure as well.

The method 400 then proceeds to block 406 where the storage device identifies one or more overprovisioned blocks in the NAND subsystems. With reference back to FIG. 6, in an embodiment of block 406, the data retention event preparation/recovery engine 304 in the storage device 300 may perform overprovisioned block identification operations 602 that may include accessing the data retention event preparation/recovery database 308 to identify overprovisioned blocks in the NAND subsystems 306, and while the data retention event preparation/recovery database 308 is illustrated as a separate database that may be provided on a memory system in the storage device 300, as discussed above the overprovisioned block(s) in the NAND subsystems 306 may be identified in a "database" provided by metadata in the NAND subsystems 306 while remaining within the scope of the present disclosure as well.

As will be appreciated by one of skill in the art in possession of the present disclosure, during the operation of the storage device 300 while it is powered on, "overprovisioned" space in the NAND subsystems 306 that may be provided by blocks in the NAND subsystems 306 that have been fully erased and/or otherwise freed up for the storage of new data (e.g., during garbage collection operations) may be recorded in the data retention event preparation/recovery database 308. One of skill in the art in possession of the present disclosure will appreciate how such overprovisioned blocks are not utilized during the data retention events described herein (e.g., as they are maintained for incoming write data and conventionally left in the erase state during power-off for use after a subsequent power-on in order to maintain a desired performance level and endurance for their storage device, and thus any writes to them prior to power-off will incur a QoS impact due to the need to erase them again for they can be used) and, as such, at block 406 those overprovisioned blocks may be identified by the data retention event preparation/recovery engine 304 for the backing up of data stored on NAND subsystems that are likely to render that data unrecoverable following the data retention event, as discussed in further detail below.

The method 400 then proceeds to block 408 where the storage device copies data stored in the subset of the NAND subsystems to the overprovisioned block(s) in the NAND subsystems. With reference back to FIG. 6, in an embodiment of block 408, the NAND subsystem access operations 600 may include copying the data stored on the subset of the NAND subsystems 306 that were determined to exceed the error threshold at block 404 to the overprovisioned block(s) in the NAND subsystems 306 identified at block 406. As will be appreciated by one of skill in the art in possession of the present disclosure, in most situations the storage space provided by the overprovisioned blocks in the NAND subsystems 306 will be sufficient to store the data included on the NAND subsystems 306 that were determined to exceed the error threshold. However, in situations in which the storage space provided by the overprovisioned blocks in the NAND subsystems 306 is not sufficient to store the data included on the NAND subsystems 306 that were determined to exceed the error threshold, a variety of data prioritization techniques may be utilized to determine which of the data included on the NAND subsystems 306 that were determined to exceed the error threshold will be copied to the overprovisioned blocks in the NAND subsystems 306 while remaining within the scope of the present disclosure.

In some embodiments, the copying of data included on the NAND subsystems 306 that were determined to exceed the error threshold to the overprovisioned blocks in the NAND subsystems 306 may include performing "page rotation" techniques at a wordline level, "wordline rotation" techniques at a block level, and/or other data rotation techniques that would be apparent to one of skill in the art in possession of the present disclosure. To provide a specific example of the page rotation techniques discussed above (an example that one of skill in the art in possession of the present disclosure will recognize applies to the wordline rotation techniques and/or other data rotation techniques as well), the reading of data from a wordline providing any of the NAND subsystems 306 discussed above that exceed the error threshold may include reading a low page, a middle page, and an upper page in that wordline (e.g., when using Triple Level Cell (TLC) storage technology that includes three pages per wordline). Subsequently, when writing a copy of that data in that wordline to the overprovisioned block(s) in the NAND subsystems 306, those pages may be written in a different order.

As such, the data in the low page read from the NAND subsystem 306 that exceeded the error threshold may be copied to a middle page in the overprovisioned block(s) in the NAND subsystems 306, the data in the middle page read from the NAND subsystem 306 that exceeded the error threshold may be copied to a upper page in the overprovisioned block(s) in the NAND subsystems 306, and the data in the upper page read from the NAND subsystem 306 that exceeded the error threshold may be copied to a low page in the overprovisioned block(s) in the NAND subsystems 306. As will be appreciated by one of skill in the art in possession of the present disclosure, such page rotation techniques address the fact that data in the upper pages in a wordline like those discussed above may be the most susceptible to data retention effects, and rotation of those pages in the overprovisioned blocks in the NAND subsystems 306 ensures that the copy of the data stored in the upper page read from the NAND subsystem 306 that exceeded the error threshold (which is the most susceptible to data retention effects) is not stored as an upper page in the overprovisioned block(s) in the NAND subsystems 306 (which would also be the most susceptible to data retention effects). One of skill in the art in possession of the present disclosure will appreciate how embodiments that utilize such page rotation techniques (or wordline rotation techniques or other data rotation techniques) may store page rotation information in the data retention event preparation/recovery database 308 to allow the data stored in the overprovisioned block(s) in the NAND subsystems 306 to be correctly read back and rewritten to the in the NAND subsystems 306 in the event doing so is necessary during the recovery operations discussed below.

The method 400 then proceeds to block 410 where the storage device powers off the NAND subsystems to begin the data retention event. In an embodiment, at block 410 and following the copying of the data included on the NAND subsystems 306 that were determined to exceed the error threshold to the overprovisioned blocks in the NAND subsystem 306, the data retention event preparation/recovery engine 304 in the storage device 300 may cause the storage device 300 (and thus the NAND subsystems 306) to power off, and one of skill in the art in possession of the present disclosure will appreciate how the powering off of the storage device 300 and the NAND subsystems 306 operates to begin the data retention event for the storage device 300/NAND subsystems 306.

Figure 7:
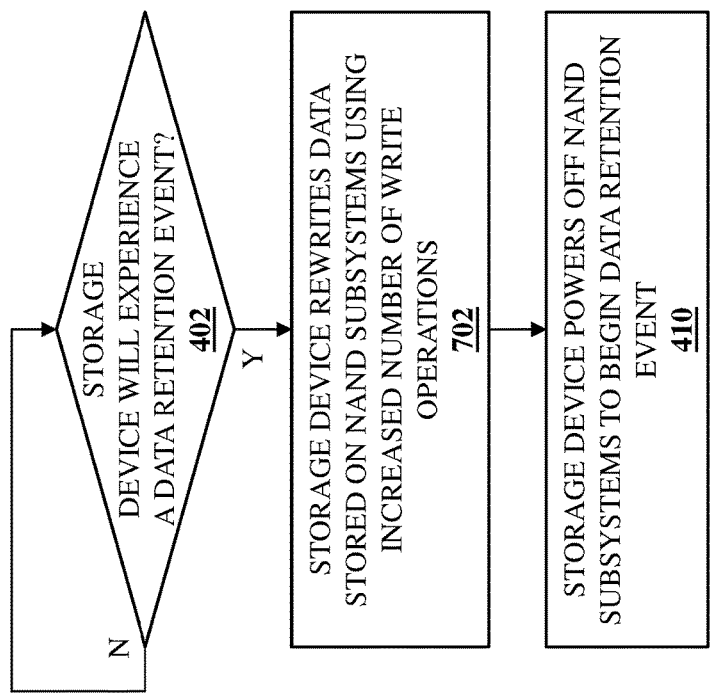
FIG. 7 is a flow chart illustrating an embodiment of a method for preparing for a data retention event in a storage device.

Referring now to FIG. 7, an embodiment of a method 700 for preparing for a data retention event in a storage device is illustrated that is similar to the method 400 discussed above with reference to FIG. 4, and similar blocks have been provided with the same element numbers. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, rewrites data that is stored on the plurality of NAND subsystems using an increased number of write operations relative to a number of write operations used in the writing of that data to the plurality of NAND subsystems, with the rewriting of the data using the increased number of write operations reducing a voltage range of that data. As such, the recoverability of data stored on the storage device subsequent to the data retention event is increased, and the time needed to recover that data is reduced.

Figure 8:
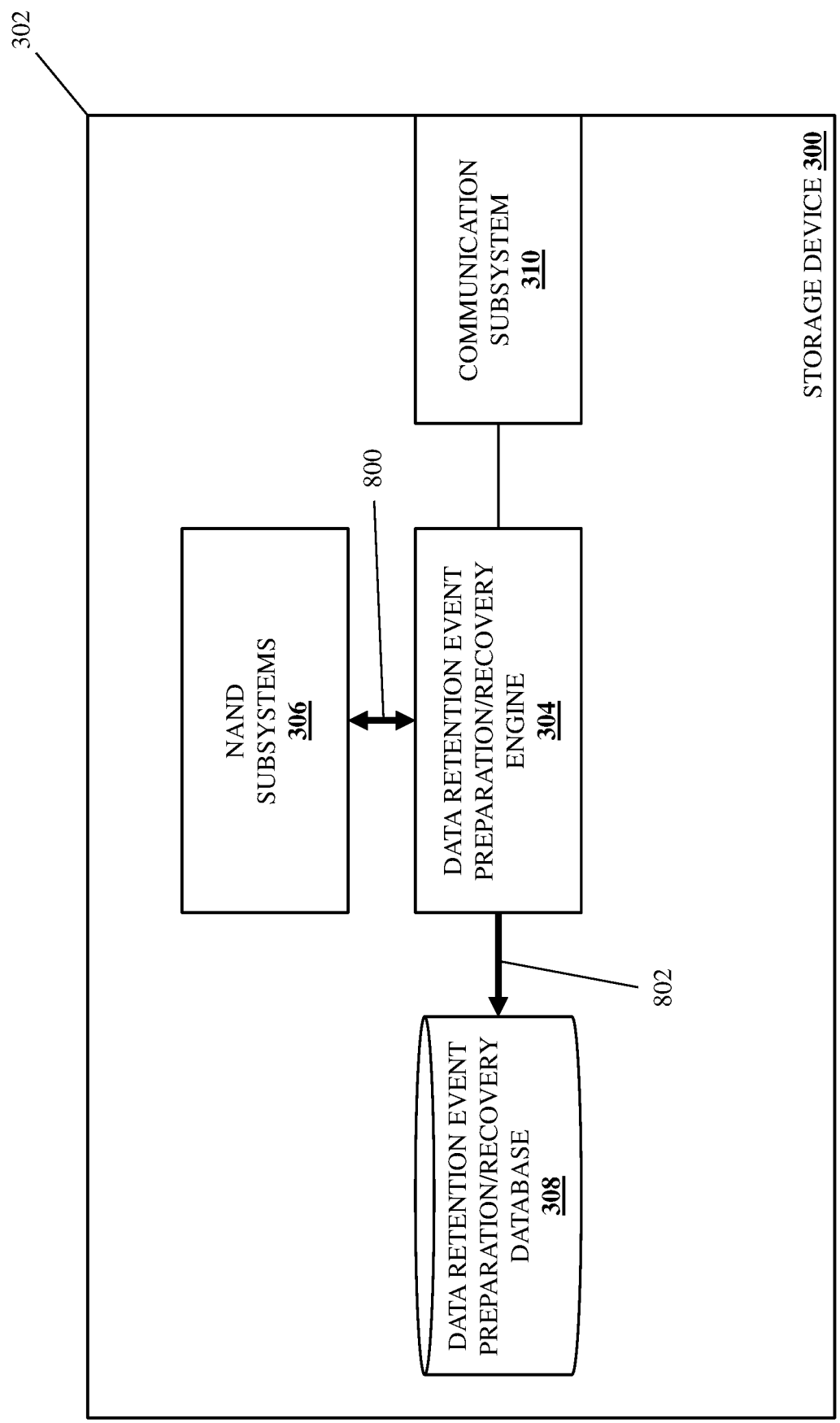
FIG. 8 is a schematic view illustrating an embodiment of the storage device of FIG. 3 operating during the method of FIG. 4.

The method 700 begins at decision block 402 where it is determined whether a storage device will experience a data retention event similarly as described above with reference to the method 400 of FIG. 4. The method 700 then proceeds to block 702 where the storage device rewrites data stored on the NAND subsystems using an increased number of write operations. With reference to FIG. 8, in an embodiment of block 702, the data retention event preparation/recovery engine 304 in the storage device 300 may perform data rewrite operations 800 that include rewriting data that is stored on the NAND subsystems 306 using an increased number of write operations relative to a number of write operations used in the immediately previous writing of that data to the NAND subsystems 306.

As such, the data rewrite operations 800 may include copying the data that is stored on the NAND subsystems 306 (e.g., to a memory system that provides the data retention event preparation/recovery engine 304), and then writing that data back to the NAND subsystem 306 using an increased number of write operations (i.e., relative to the number of write operations used to originally write that data to the NAND subsystems 306 prior to the copying) in order to provide more granularity, higher precision, and/or a "tighter" distribution of the voltage magnitudes of the cells in each given voltage state in the NAND subsystems 306 such that the variation of the voltage range of data stored per voltage state in any cells in the NAND subsystems 306 is reduced relative to the variation of the voltage range of that data stored per voltage state in cells in the NAND subsystems 306 prior to the data rewrite operations 800 In other words, it is the variation of voltages in any particular voltage state (e.g., with 8 possible voltage states in a TLC NAND subsystem) that will be "tightened" or otherwise reduced, rather than the programmed voltage patterns (i.e., of zeros and ones).

For example, and as will be appreciated by one of skill in the art in possession of the present disclosure, at block 702 the blocks in the NAND subsystems 306 may be initially stored in an erase state that is generally a relatively low voltage state. In conventional operations and once a pattern to be programmed for a wordline in the NAND subsystem 306 is determined and the program operation is triggered, charge may be added to the individual NAND gates in a NAND subsystem in discrete pulses until the NAND gate voltage reaches a desired range. As will be appreciated by one of skill in the art in possession of the present disclosure, such charging of the individual NAND gates in a NAND subsystem may be performed on a plurality of NAND gates in a wordline at once, and each of those NAND gates may not respond in exactly the same way, resulting in some scatter in the programmed voltage across those NAND gates. As such, with the data retention event preparation/recovery engine 304 in the storage device 300 programming the NAND gates in the NAND subsystems 306 with relatively more, smaller charging operations at block 702, that programming will take a relatively longer time but the scatter in the programmed voltage across the NAND gates will be reduced, and the reduction of the variation prior to the data retention event will lead to reduced variation after the data retention event.

As also illustrated in FIG. 8 and will be appreciated by one of skill in the art in possession of the present disclosure, at block 702 the data retention event preparation/recovery engine 304 in the storage device 300 may perform data recovery information storage operations 802 that may include storing a list of physical addresses (e.g., identifying pages, wordlines, blocks, etc. that have been copied), mappings to any overprovisioned blocks that were used to backup data, and/or any other data recovery information in the data retention event preparation/recovery database 308 that one of skill in the art in possession of the present disclosure would recognize as allowing for data recovery operations in light of the data rewrite operations 800 and following the data retention event, and while the data retention event preparation/recovery database 308 is illustrated as a separate database that may be provided on a memory system in the storage device 300, as discussed above the data recovery information may be identified in a "database" provided by metadata in the NAND subsystems 306 while remaining within the scope of the present disclosure as well. The method 700 then proceeds to block 410 where the storage device powers off the NAND subsystems to begin the data retention event similarly as described above with reference to the method 400 of FIG. 4.

Figure 9:
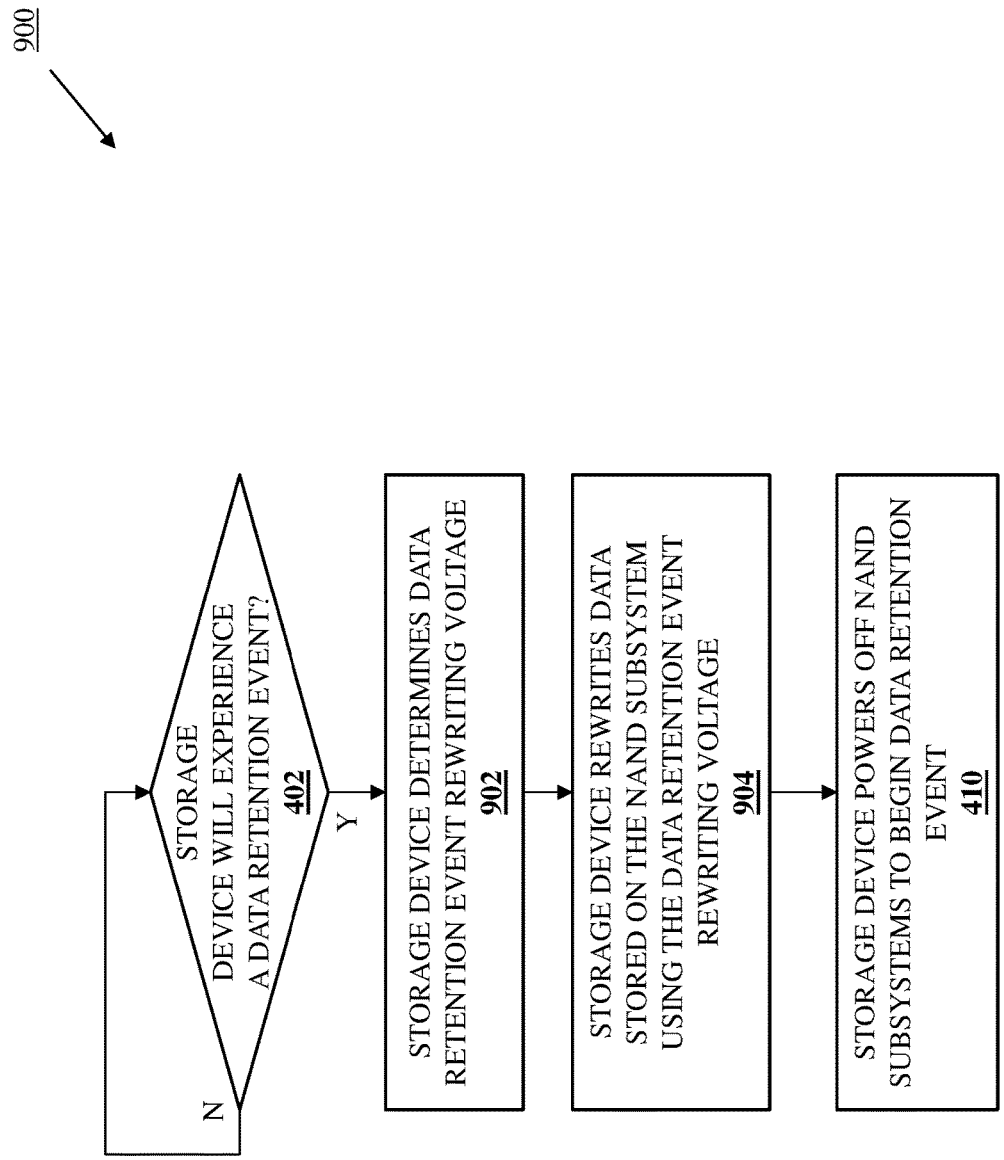
FIG. 9 is a flow chart illustrating an embodiment of a method for preparing for a data retention event in a storage device.

Referring now to FIG. 9, an embodiment of a method 900 for preparing for a data retention event in a storage device is illustrated that is similar to the method 400 discussed above with reference to FIG. 4, and similar blocks have been provided with the same element numbers. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, determines a data retention event rewriting voltage that is greater than a writing voltage that was used to write data that is stored in the plurality of NAND subsystems and that is sufficient to compensate for voltage reductions that occur during the data retention event, and rewrites the data that is stored on the plurality of NAND subsystems using the data retention event rewriting voltage. As such, the recoverability of data stored on the storage device subsequent to the data retention event is increased, and the time needed to recover that data is reduced.

The method 900 begins at decision block 402 where it is determined whether a storage device will experience a data retention event similarly as described above with reference to the method 400 of FIG. 4. The method 900 then proceeds to block 902 where the storage device determines a data retention event rewriting voltage. In an embodiment, at block 902, the data retention event preparation/recovery engine 304 in the storage device 300 may perform data retention event rewriting voltage determination operations that include determining a data retention event rewriting voltage that is greater than a writing voltage that was used to write data that is stored in the NAND subsystems 306 and that is sufficient to compensate for voltage reductions that are expected to occur during the data retention event.

As such, the retention event rewriting voltage determination operations may include retrieving, estimating, and/or otherwise determining a duration of the data retention event that the storage device will experience. For example, the expected duration of the data retention event may be received along with the request to prepare for the data retention event at decision block 402. In another example, in response to receiving the instruction to prepare for the data retention event at decision block 402, the data retention event preparation/recovery engine 304 may provide a request via the network 204 and to the management device 202 for an expected duration of the data retention event, and may receive the expected duration of the data retention event back from a user via the management device 202 and the network 204. In yet another example, the data retention event preparation/recovery engine 304 may estimate the duration of the data retention event by identifying duration (s) of one or more previous data retention events and determining an average duration of previous data retention events. In yet another example, the data retention event preparation/recovery engine 304 may assume a maximum data retention event that has a duration of the "datasheet requirements" for the storage device 300 (e.g., 3 months in the specific example provided above). However, while several specific examples have been provided, one of skill in the art in possession of the present disclosure will appreciate how the duration of the data retention event may be retrieved, estimated, and/or otherwise determined in a variety of manners that will fall within the scope of the present disclosure.

At block 902, the data retention event preparation/recovery engine 304 may then determine a data retention event rewriting voltage that is sufficient to compensate for voltage reductions that will occur over the duration of the data retention event determined as discussed above, and one of skill in the art in possession of the present disclosure will appreciate how that data retention event rewriting voltage will be greater than a writing voltage that was used to perform the immediately previous write of the data that is stored in the NAND subsystems 306. As will be appreciated by one of skill in the art in possession of the present disclosure, the use of a rewrite voltage that is greater than the "original" write voltage as described above operates to "over-program" the cells in the NAND subsystems 306 in anticipation of the voltage reductions that will occur during the data retention event.

Figure 10:
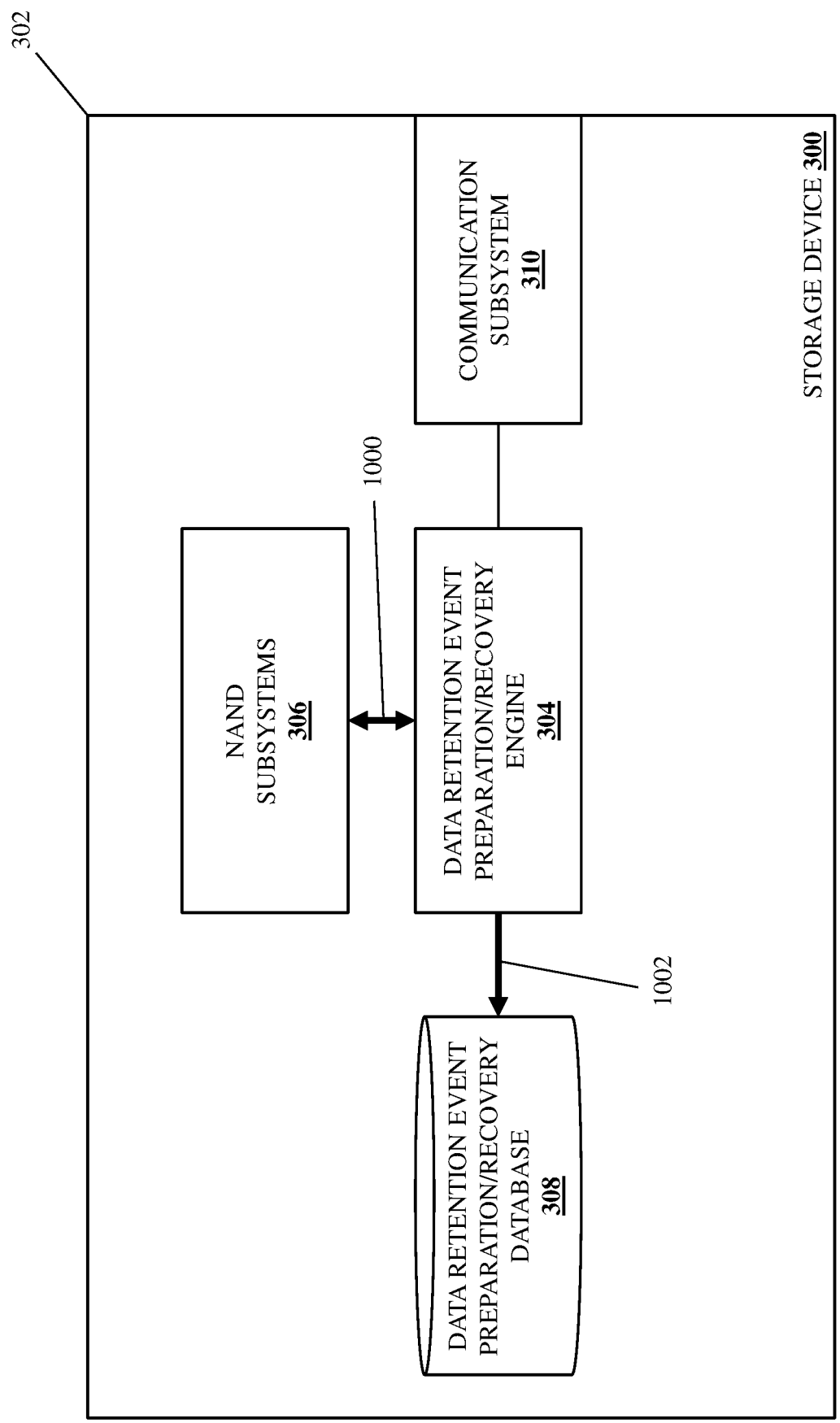
FIG. 10 is a schematic view illustrating an embodiment of the storage device of FIG. 3 operating during the method of FIG. 4.

The method 900 then proceeds to block 904 where the storage device rewrites the data stored on the NAND subsystem using the data retention event rewriting voltage. With reference to FIG. 10, in an embodiment of block 904, the data retention event preparation/recovery engine 304 in the storage device 300 may perform data rewrite operations 1000 that include rewriting data that is stored on the NAND subsystems 306 using the data retention event rewriting voltage determined at block 902. As such, the data rewrite operations 1000 may include copying the data that is stored on the NAND subsystems 306 (e.g., to a memory system that provides the data retention event preparation/recovery engine 304), and then writing that data back to the NAND subsystem 306 using the data retention event rewriting voltage determined at block 902 in order to "over-program" the cells in the NAND subsystems 306 in anticipation of the voltage reductions that will occur during the data retention event.

As also illustrated in FIG. 10 and will be appreciated by one of skill in the art in possession of the present disclosure, at block 904 the data retention event preparation/recovery engine 304 in the storage device 300 may perform data recovery information storage operations 1002 that may include storing identifications of wordlines upon which the data rewrites were performed at block 904, as well as read retry voltage thresholds that are optimized for those data rewrites (as opposed to read retry voltage thresholds for wordlines that were not subject to the data rewrites at block 904), as well as any other data recovery information, in the data retention event preparation/recovery database 308 that one of skill in the art in possession of the present disclosure would recognize as allowing for data recovery operations in light of the data rewrite operations 1000 and following the data retention event, and while the data retention event preparation/recovery database 308 is illustrated as a separate database that may be provided on a memory system in the storage device 300, as discussed above the data recovery information may be identified in a "database" provided by metadata in the NAND subsystems 306 while remaining within the scope of the present disclosure as well. The method 900 then proceeds to block 410 where the storage device powers off the NAND subsystems to begin the data retention event similarly as described above with reference to the method 400 of FIG. 4.

Figure 11:
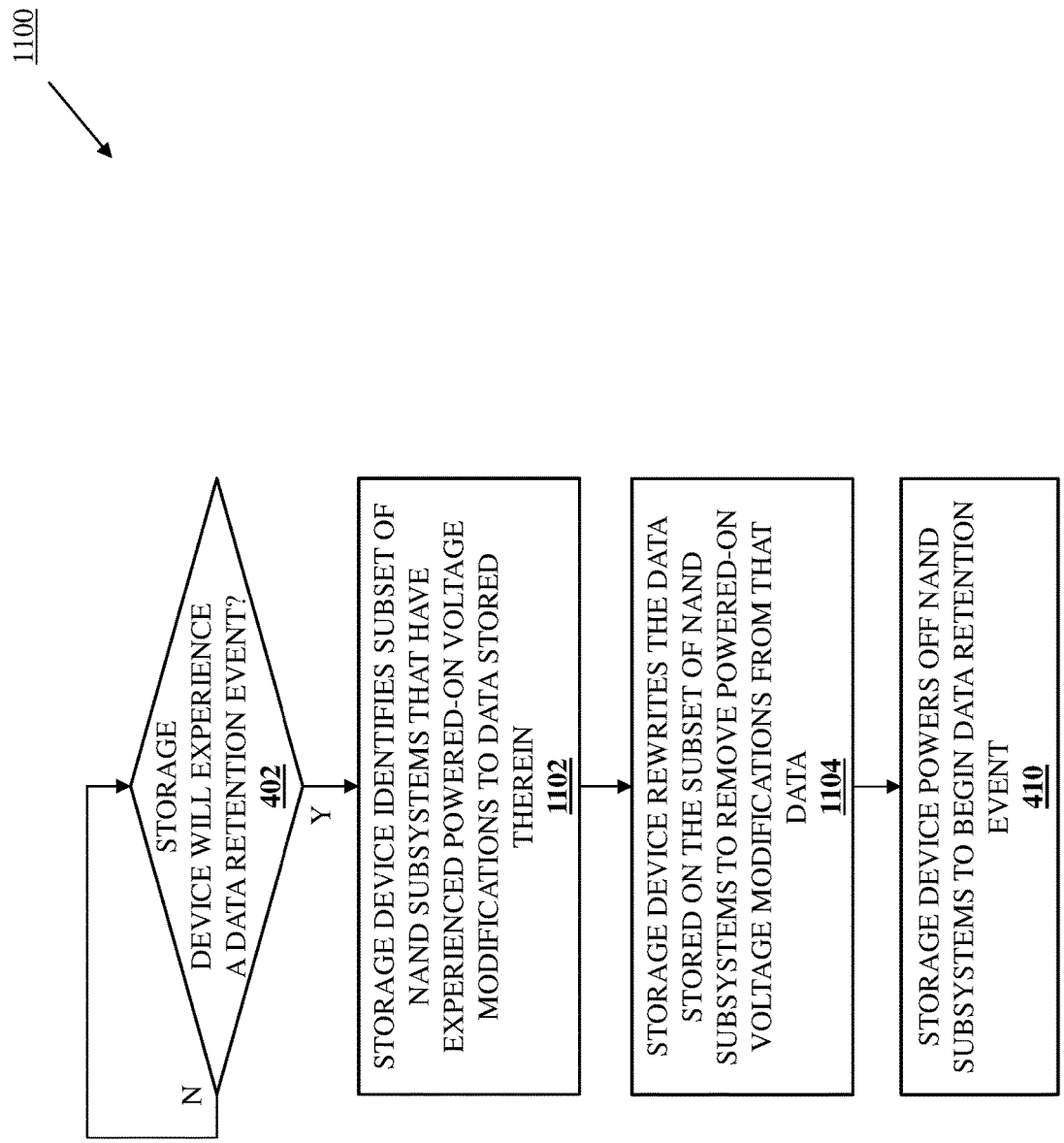
FIG. 11 is a flow chart illustrating an embodiment of a method for preparing for a data retention event in a storage device.

Referring now to FIG. 11, an embodiment of a method 1100 for preparing for a data retention event in a storage device is illustrated that is similar to the method 400 discussed above with reference to FIG. 4, and similar blocks have been provided with the same element numbers. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, identifies a subset of the plurality of NAND subsystems that have experienced powered-on voltage modifications to the data stored therein, and rewrites the data stored on the second subset of the plurality of NAND subsystems to remove the powered-on voltage modifications from that data. As such, the recoverability of data stored on the storage device subsequent to the data retention event is increased, and the time needed to recover that data is reduced.

Figure 12:
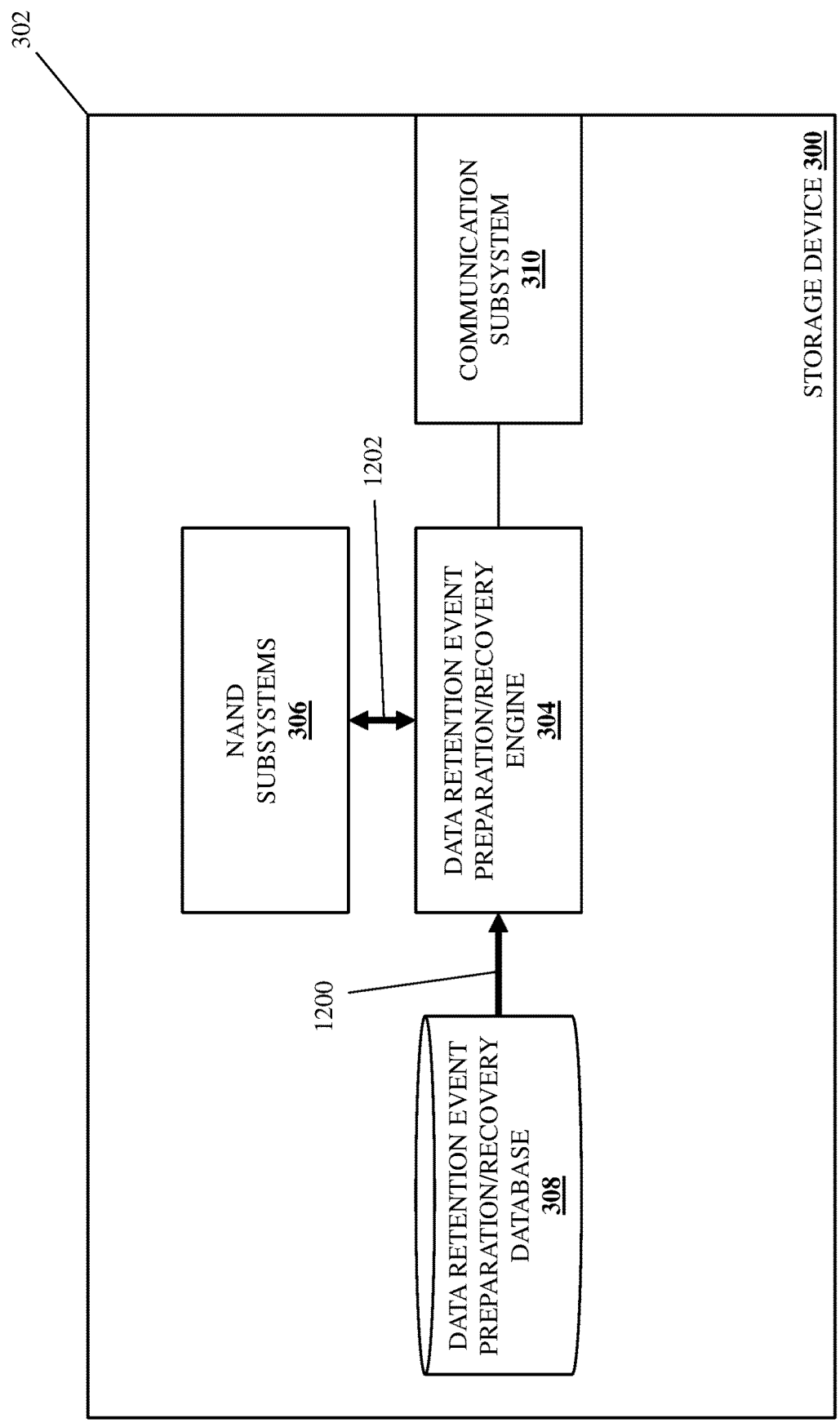
FIG. 12 is a schematic view illustrating an embodiment of the storage device of FIG. 3 operating during the method of FIG. 4.

The method 1100 begins at decision block 402 where it is determined whether a storage device will experience a data retention event similarly as described above with reference to the method 400 of FIG. 4. The method 1100 then proceeds to block 1102 where the storage device identifies a subset of NAND subsystems that have experienced powered-on voltage modifications to data stored thereon. With reference to FIG. 12, in an embodiment of block 1102, the data retention event preparation/recovery engine 304 in the storage device 300 may perform powered-on voltage modification identification operations 1200 that may include accessing the data retention event preparation/recovery database 308 to identify powered-on voltage modifications that have occurred in subsets of the NAND subsystems 306 due to read operations performed on those subsets of the NAND subsystems 306.

As will be appreciated by one of skill in the art in possession of the present disclosure, repeated reads to any particular cells in a NAND subsystems will operate to "microprogram" or otherwise increase the voltages in adjacent cells in those NAND subsystems in a phenomenon known as the "read disturb effect", and operate to modify the voltages in those adjacent cell (and in some extreme cases change the value those cells from what was originally written). As such, the number of read operations performed on cells in the NAND subsystems 306 may be recorded in the data retention event preparation/recovery database 308 during powered-on operations of the storage device 300, and at block 1102 that information may be used to identify NAND subsystems that have experienced read disturb effects above a threshold.

Figure 13:
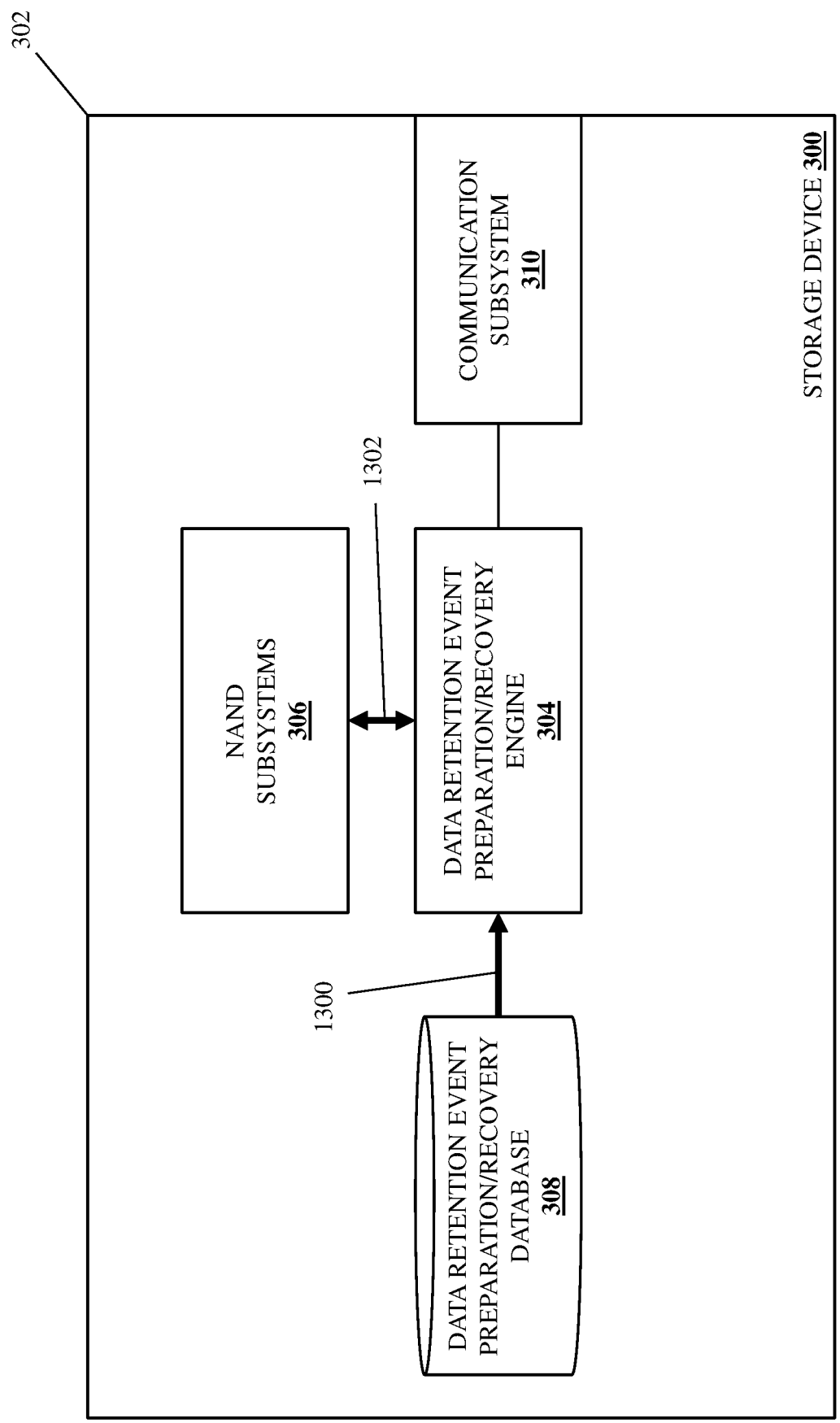
FIG. 13 is a schematic view illustrating an embodiment of the storage device of FIG. 3 operating during the method of FIG. 4.

With reference to FIG. 13, in an embodiment of block 1102, the data retention event preparation/recovery engine 304 in the storage device 300 may perform powered-on voltage modification identification operations 1300 that may include accessing the data retention event preparation/recovery database 308 to identify powered-on voltage modifications that have occurred in subsets of the NAND subsystems 306 due to "online" data retention in those subsets of the NAND subsystems 306 that has occurred while the storage device was powered-on. As discussed above and as will be appreciated by one of skill in the art in possession of the present disclosure, the storage of data in a NAND subsystem for extended periods of time prior to rewriting or refreshing that data will result in data retention effects that operate to decrease the voltage of cells that store that data. As such, the length of time data has been stored in cells in the NAND subsystems 306 may be identified in the data retention event preparation/recovery database 308 during powered-on operations of the storage device 300 (e.g., by recording a time that data was written), and at block 1102 that information may be used to identify NAND subsystems that have experienced "online" data retention effects above a threshold (e.g., a powered-on, time based voltage reduction in the cells of those NAND subsystems).

The method 1100 then proceeds to block 1104 where the storage device rewrites the data stored on the subset of NAND subsystems to remove powered-on voltage modifications from that data. With reference to FIG. 12, in an embodiment of block 1104, the data retention event preparation/recovery engine 304 in the storage device 300 may perform data rewrite operations 1202 that include rewriting the data that is stored on the subset of the NAND subsystems 306 to remove the read-disturb effects experienced by that subset of the NAND subsystems 306. As such, the data rewrite operations 1202 may include copying the data that is stored on the subset of the NAND subsystems 306 (e.g., to a memory system that provides the data retention event preparation/recovery engine 304) and then writing that data back to the NAND subsystem 306 as part of, for example, garbage collection operations. As will be appreciated by one of skill in the art in possession of the present disclosure, the data rewrite operations 1202 will operate to remove the read disturb effects associated with the data that is rewritten prior to the data retention event.

With reference to FIG. 13, in an embodiment of block 1104, the data retention event preparation/recovery engine 304 in the storage device 300 may perform data rewrite operations 1302 that include rewriting the data that is stored on the subset of the NAND subsystems 306 to remove the "online" data retention effects experienced by that subset of the NAND subsystems 306. As such, the data rewrite operations 1302 may include copying the data that is stored on the subset of the NAND subsystems 306 (e.g., to a memory system that provides the data retention event preparation/recovery engine 304) and then writing that data back to the NAND subsystem 306 as part of, for example, garbage collection operations. As will be appreciated by one of skill in the art in possession of the present disclosure, the data rewrite operations 1302 will operate to remove the "online" data retention effects associated with the data that is rewritten prior to the "offline" data retention event.

Figure 14:
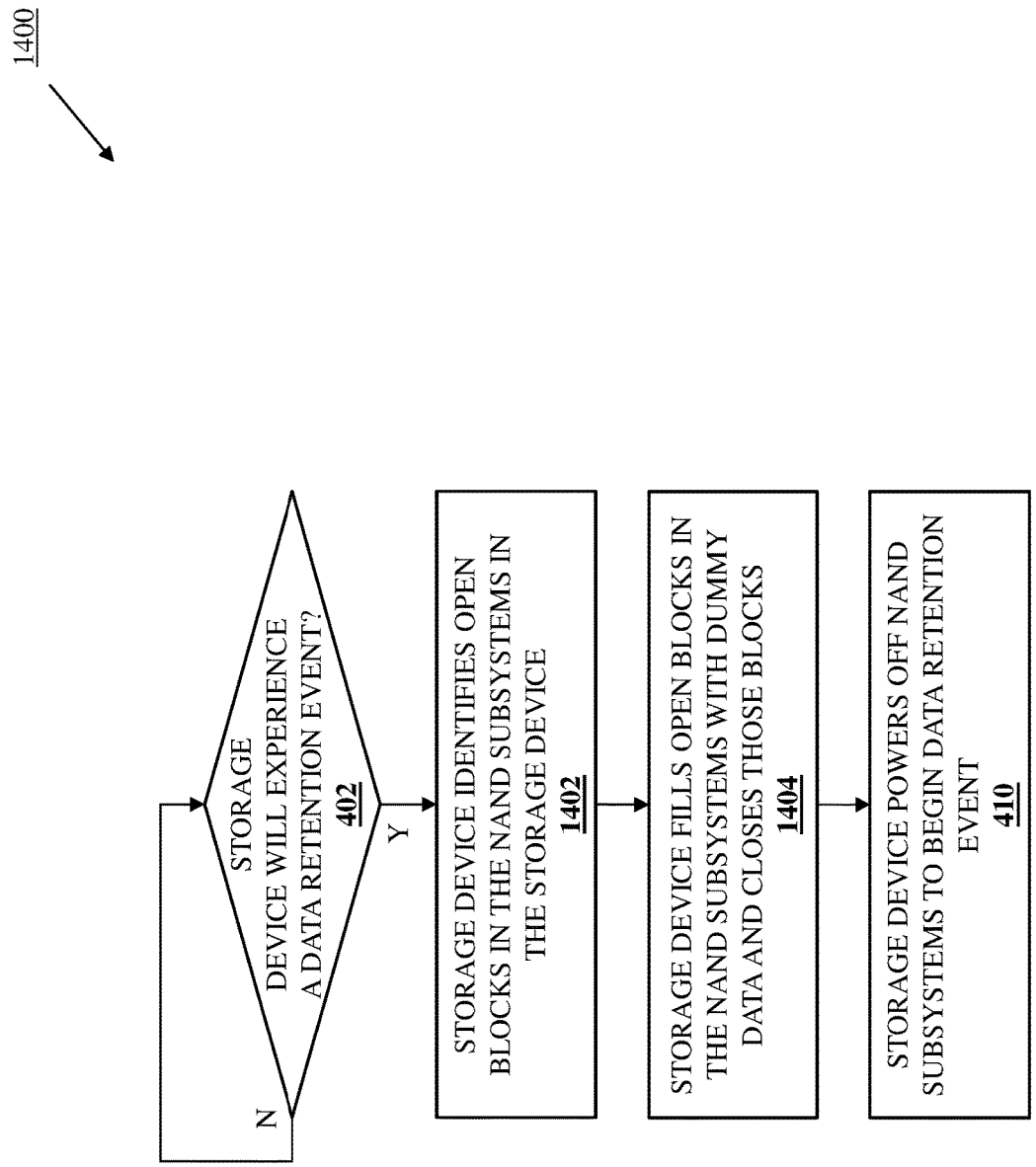
FIG. 14 is a flow chart illustrating an embodiment of a method for preparing for a data retention event in a storage device.
Figure 15:
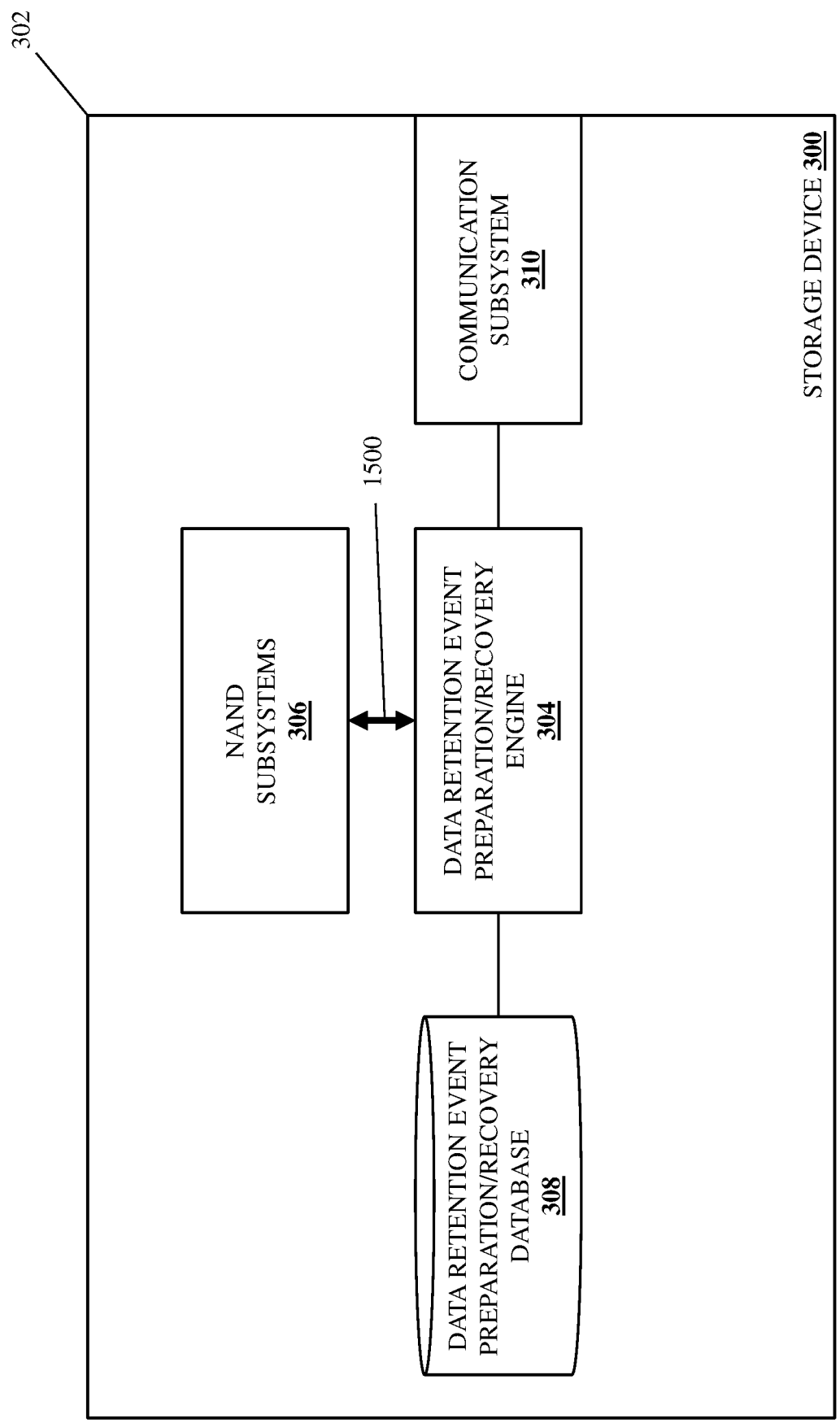
FIG. 15 is a schematic view illustrating an embodiment of the storage device of FIG. 3 operating during the method of FIG. 4.

Referring now to FIG. 14, an embodiment of a method 1400 for preparing for a data retention event in a storage device is illustrated that is similar to the method 400 discussed above with reference to FIG. 4, and similar blocks have been provided with the same element numbers. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. The data retention event preparation/recovery subsystem determines that the plurality of NAND subsystems will experience a data retention event and, in response, identifies open blocks in the NAND subsystems, writes sufficient "dummy" data to bring the open wordlines into a closed state. As such, the recoverability of data stored on the storage device subsequent to the data retention event is increased, and the time needed to recover that data is reduced.

The method 1400 begins at decision block 1402 where it is determined whether a storage device will experience a data retention event similarly as described above with reference to the method 400 of FIG. 4. The method 1400 then proceeds to block 1402 where the storage device identifies open blocks in NAND subsystems in the storage device. With reference to FIG. 14, in an embodiment of block 1402, the data retention event preparation/recovery engine 304 in the storage device 300 may perform NAND subsystem access operations 1500 that may include accessing the NAND subsystems 306 to identify "open" blocks in the NAND subsystems 306. As will be appreciated by one of skill in the art in possession of the present disclosure, "open" blocks are blocks in the NAND subsystems 306 that are in the process of being written, and thus those open blocks will include some number of pages that are in an "erased" state, and any of a variety of techniques known in the art may be used to identify the open blocks at block 1402.

The method 1400 then proceeds to block 1404 where the storage device writes dummy data to wordlines adjacent to the open wordlines in order to render them closed. With reference to FIG. 14, in an embodiment of block 1404, the NAND subsystem access operations 1500 may include writing "dummy" data (e.g., a randomized pattern of data) to any open pages included in the open blocks identified at block 1402 in order to close those open blocks. As will be appreciated by one of skill in the art in possession of the present disclosure, the closing of open wordlines in the NAND subsystems 306 may prepare those NAND subsystems 306 for the data retention event by, for example, preventing unwritten cells in open blocks in the NAND subsystems 306 from interfering with written cells in the NAND subsystem, and eliminates the need to compensate for unwritten cells in open blocks in the NAND subsystem after power up of the storage device following the data retention event.

Figure 16A:
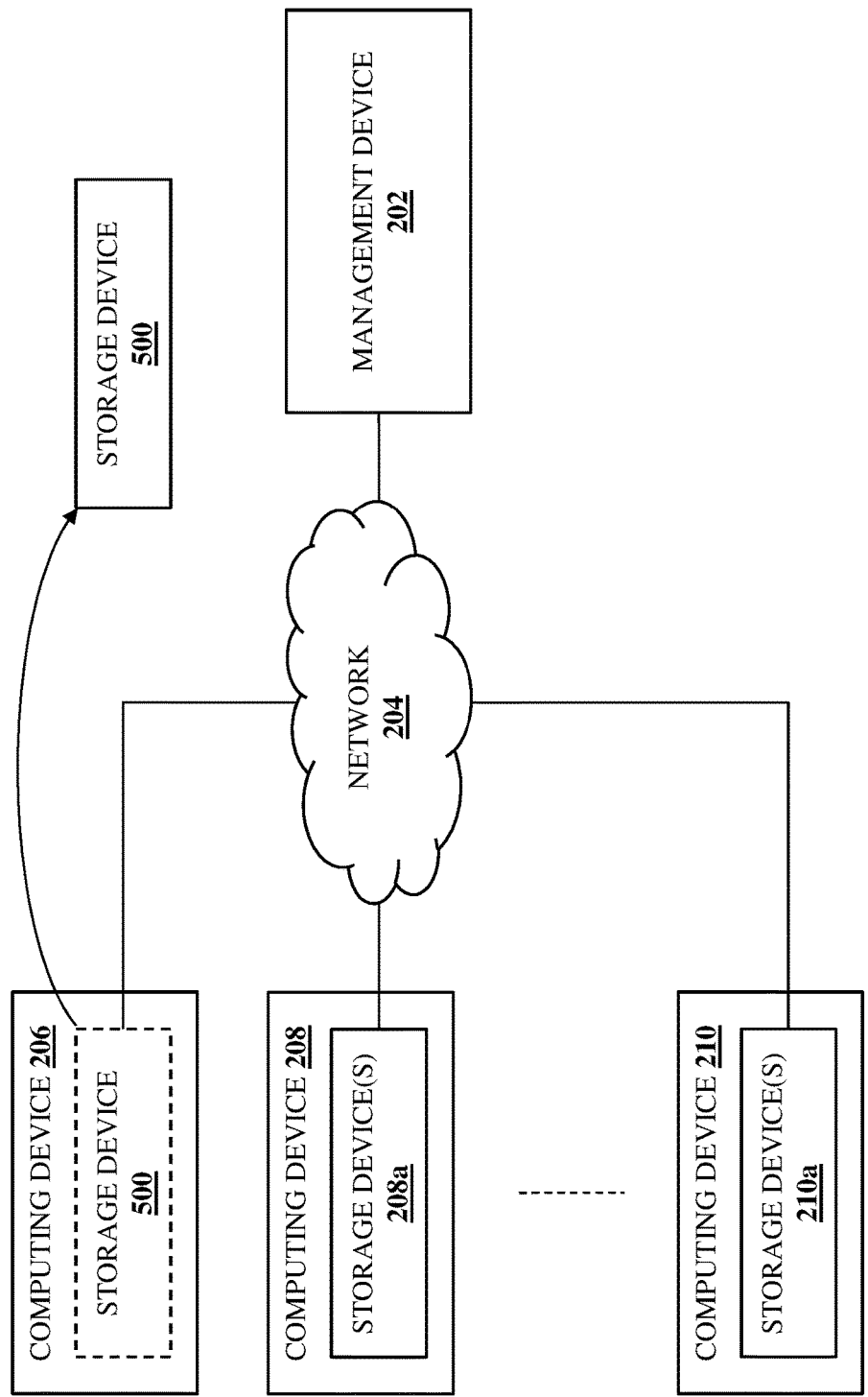
FIG. 16A is a schematic view illustrating an embodiment of the networked system of FIG. 2 operating during the method of FIG. 4.
Figure 16B:
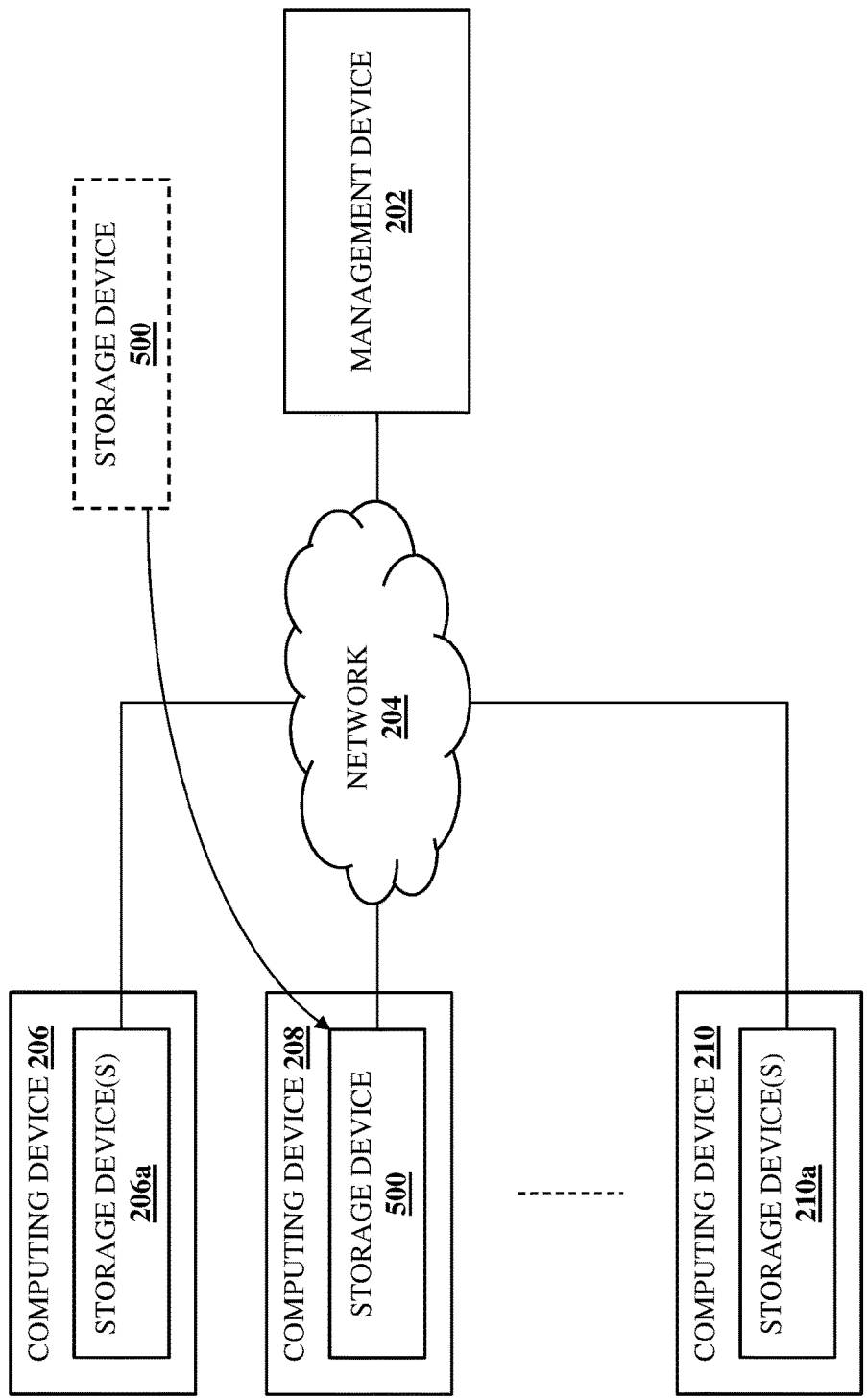
FIG. 16B is a schematic view illustrating an embodiment of the networked system of FIG. 2 operating during the method of FIG. 4.

With reference to FIG. 16A, following any of the methods, any combination of methods, or all of the methods discussed above, the storage device 500 that was prepared for the data retention event may be removed from the computing device 206 during the data retention event. Furthermore, with reference to FIG. 16B, nearing the end of the data retention event, the storage device 500 may be provided in the computing device 208 (e.g., as one of the storage devices 208a discussed above with reference to FIG. 2) and powered on to end the data retention event. However, while the storage device 500 has been illustrated and described as being removed from the computing device that is coupled to the management device 202 via the network 204, and then provided back in the computing device 208 that is also coupled to the management device 202 via the network 204, one of skill in the art in possession of the present disclosure will appreciate that storage devices prepared for a data retention event according to the teachings of the present disclosure (and then experiencing that data retention event) may be subsequently provided in any computing devices, other datacenters, the same computing device from which they were removed, and/or in any other computing device that would be apparent to one of skill in the art in possession of the present disclosure.

Figure 17:
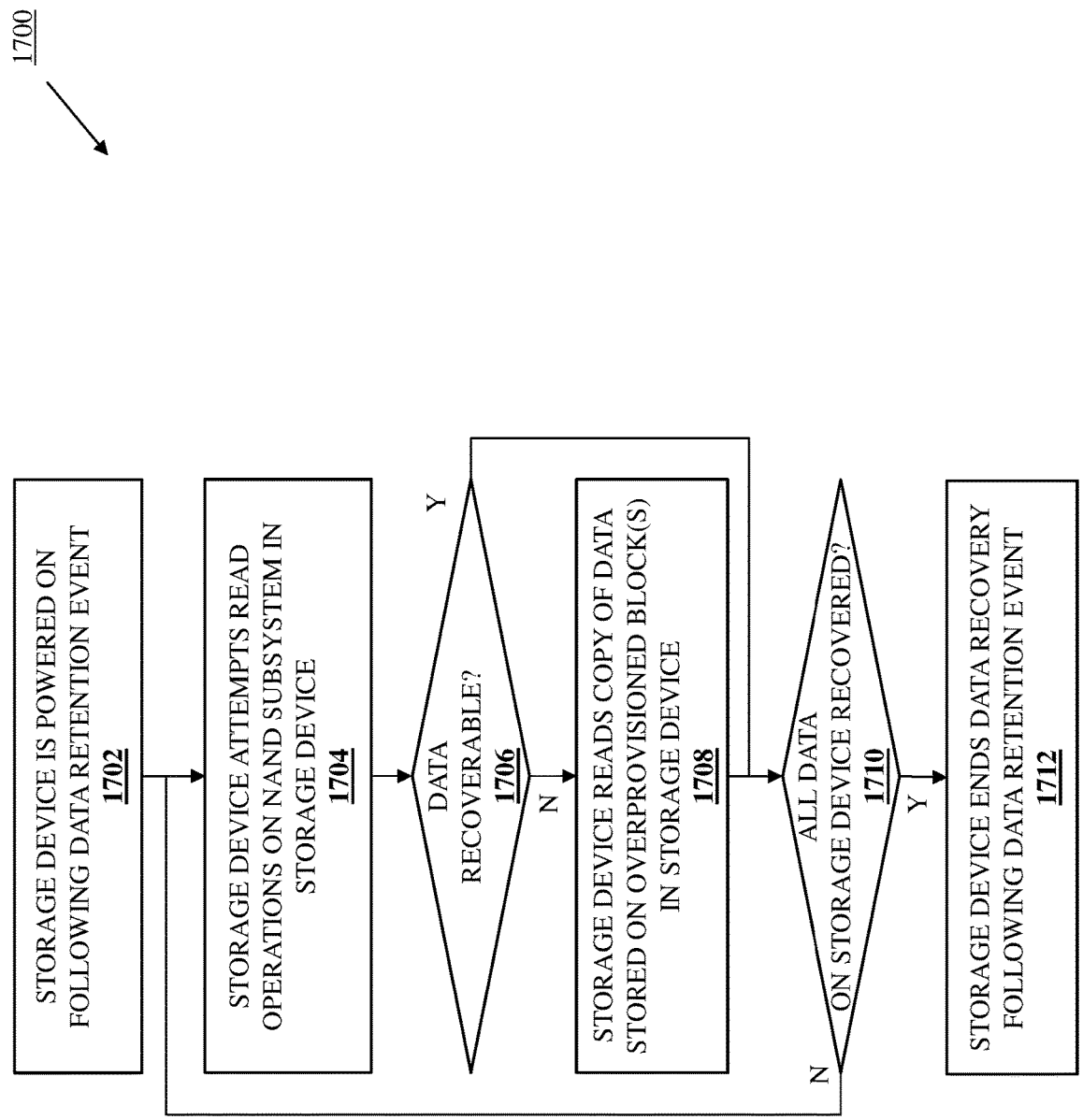
FIG. 17 is a flow chart illustrating an embodiment of a method for recovering a data retention event in a storage device.

Referring now to FIG. 17, an embodiment of a method 1700 for recovering from data retention event in a storage device is illustrated. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. In response to powering on of the plurality of NAND subsystems following the powering off the plurality of NAND subsystems, the data retention event preparation/recovery subsystem attempts read operations on a first NAND subsystem included in the first subset of the plurality of NAND subsystems, determines that first data that is stored on the first NAND subsystem is unrecoverable, and reads second data that is a copy of the first data and that is stored on a first overprovisioned block included in the at least one overprovisioned block in the plurality of NAND subsystems. As such, in the event that data is unrecoverable following a data retention event, it may be accessed from the overprovisioned blocks to which it was copied.

Figure 18A:
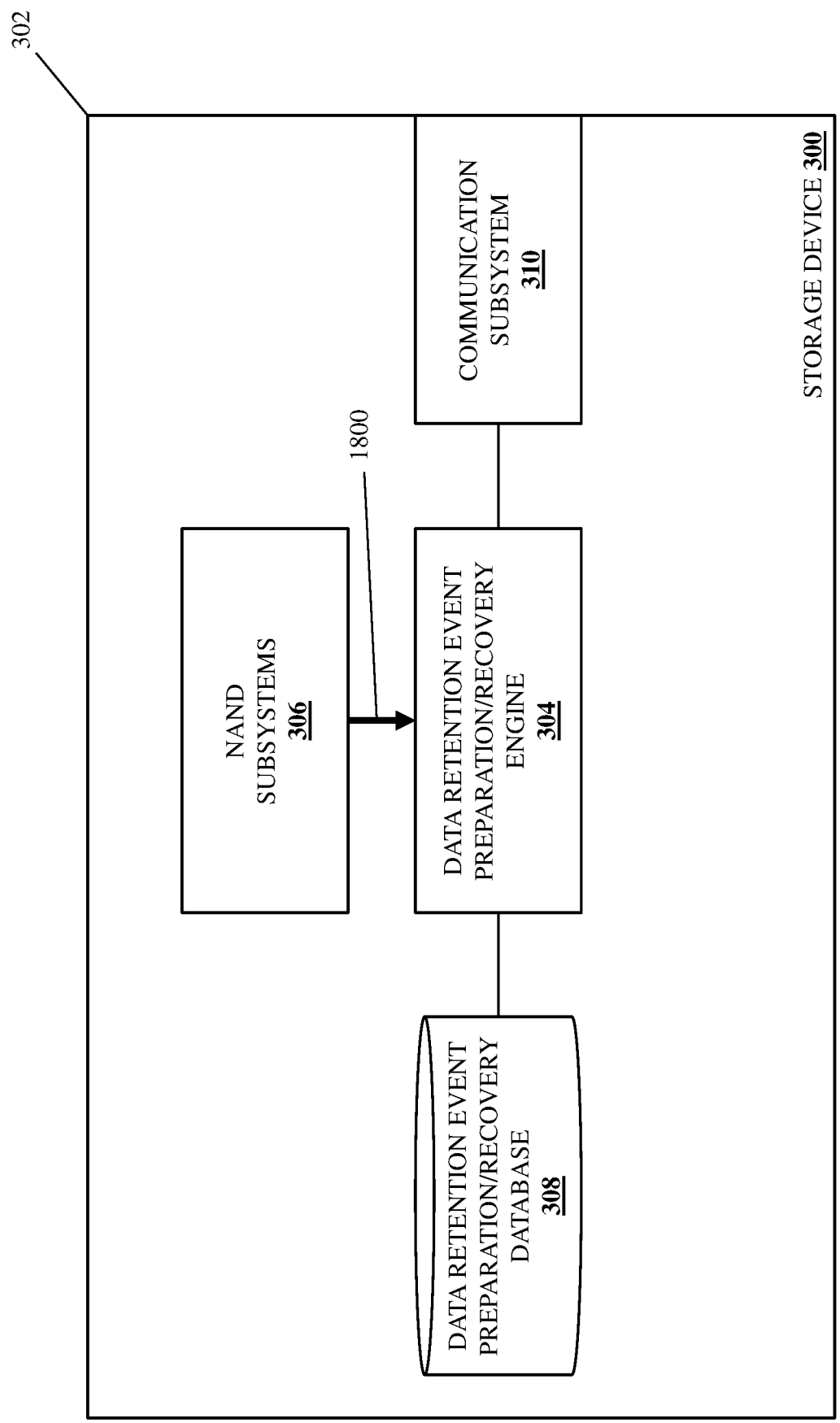
FIG. 18A is a schematic view illustrating an embodiment of the storage device of FIG. 3 operating during the method of FIG. 4.

The method 1700 begins at block 1702 where a storage device is powered on following a data retention event. In an embodiment, at block 1702 and following any of the data retention events discussed above, the storage device 300 may be powered on. As such, with reference to the embodiment discussed above with reference to FIGS. 16A and 16B, at block 1702 the storage device 300/500 may be provided in the computing device 208 and powered on following the data retention event. The method 1700 then proceeds to block 1704 where the storage device attempts read operations on a NAND subsystem in the storage device. With reference to FIG. 18A, in an embodiment of block 1704, the data retention event preparation/recovery engine 304 in the storage device 300 may perform read attempt operations 1800 that may include attempting to read data stored on one of the NAND subsystems 306.

The method 1700 then proceeds to decision block 1706 where it is determined whether the data on the NAND subsystem is recoverable. In an embodiment, at decision block 1706, the data retention event preparation/recovery engine 304 in the storage device 300 may perform recoverable data determination operations that may include determining whether the data that was attempted to be read from storage on one of the NAND subsystems 306 is recoverable, and one of skill in the art in possession of the present disclosure will appreciate how that data may be determined to have been recovered or not using any of a variety of data verification techniques known in the art.

Figure 18B:
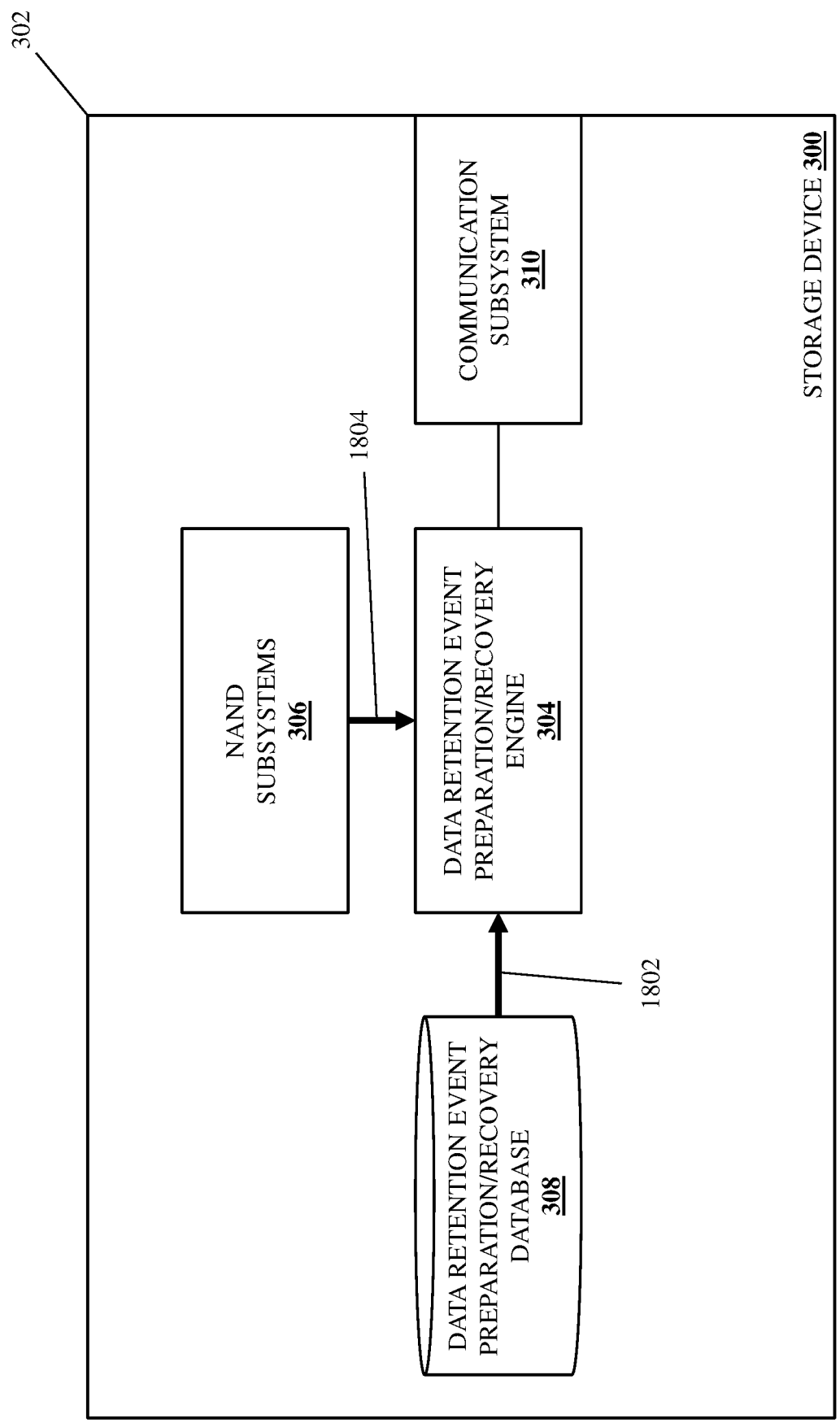
FIG. 18B is a schematic view illustrating an embodiment of the storage device of FIG. 3 operating during the method of FIG. 4.

If, at decision block 1706, it is determined that the data on the NAND subsystem is not recoverable, the method 1700 proceeds to block 1708 where the storage device reads a copy of the data stored on overprovisioned block(s) in the storage device. With reference to FIG. 18B, in an embodiment of block 1708, the data retention event preparation/recovery engine 304 in the storage device 300 may perform data copy identification operations 1802 that may include accessing the data retention event preparation/recovery database 308 to determine the overprovisioned block(s) in the NAND subsystems 306 that store the copy of the data that was determined to be unrecoverable at decision block 1706. The data retention event preparation/recovery engine 304 may then perform overprovisioned block data copy retrieval operations 1804 that include retrieving the copy of the data that is stored in the overprovisioned block(s) in the NAND subsystems 306 determined as discussed above.

If, at decision block 1706, it is determined that the data on the NAND subsystem is recoverable, or following block 1708, the method 1700 proceeds to decision block 1710 where it is determined whether all the data on the NAND subsystem has been recovered. In an embodiment, at decision block 1710, the data retention event preparation/recovery engine 304 in the storage device 300 may determine whether all the data on the storage device has been recovered. If, at decision block 1710, it is determined that all the data on the NAND subsystem has not been recovered, the method 1700 returns to block 1704. As such, the method 1700 may loop such that the data retention event preparation/recovery engine 304 continued to recover data from the NAND subsystems by reading that data from those NAND subsystems 306 and, if that data is unrecoverable, reading a copy of that data from the overprovisioned block(s) in those NAND subsystems 306.

If, at decision block 1710, it is determined that all the data on the NAND subsystem has been recovered, the method 1700 proceeds to block 1712 where the storage device ends data recovery operations following the data retention event. In an embodiment, at block 1712 and following the recovery of the data from the storage device 300 following the data retention event, the data retention event preparation/recovery engine 304 ends the data recovery operations. As will be appreciated by one of skill in the art in possession of the present disclosure, as part of the ending of the data recovery operations, the data retention event preparation/recovery engine 304 may erase the "extra" data stored in the overprovisioned block(s) in the NAND subsystems 306 in order to, for example, ensure that storage space is available for normal storage device operation.

Figure 19:
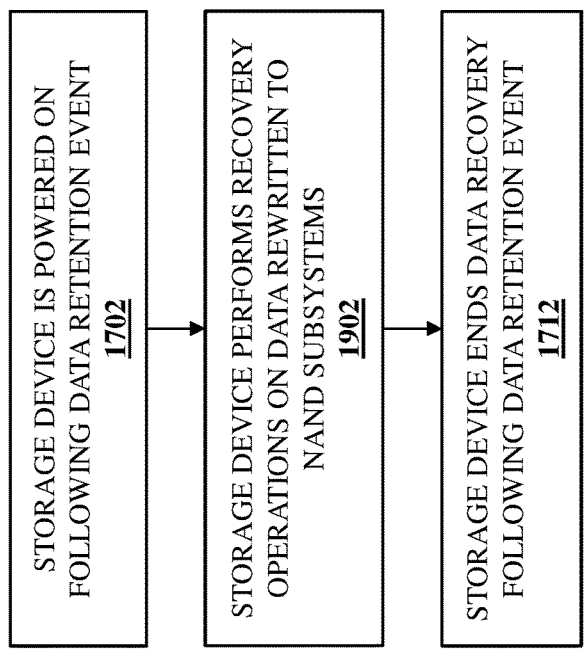
FIG. 19 is a flow chart illustrating an embodiment of a method for recovering a data retention event in a storage device.

Referring now to FIG. 19, an embodiment of a method 1900 for recovering data subsequent to a data retention event in a storage device is illustrated that is similar to the method 1700 discussed above with reference to FIG. 17, and similar blocks have been provided with the same element numbers. As discussed below, the data retention event preparation/recovery system of the present disclosure may include a chassis, a plurality of NAND subsystems included in the chassis, and a data retention event preparation/recovery subsystem that is included in the chassis and coupled to the plurality of NAND subsystems. In response to powering on of the plurality of NAND subsystems following the powering off the plurality of NAND subsystems, the data retention event preparation/recovery subsystem performs recovery operations on data rewritten to the NAND subsystems. As will be appreciated by one of skill in the art in possession of the present disclosure, the data retention event preparation operations discussed above increase the recoverability of data stored on the storage device subsequent to the data retention event, and reduce the time needed to recover that data, during the method 1700.

Figure 20:
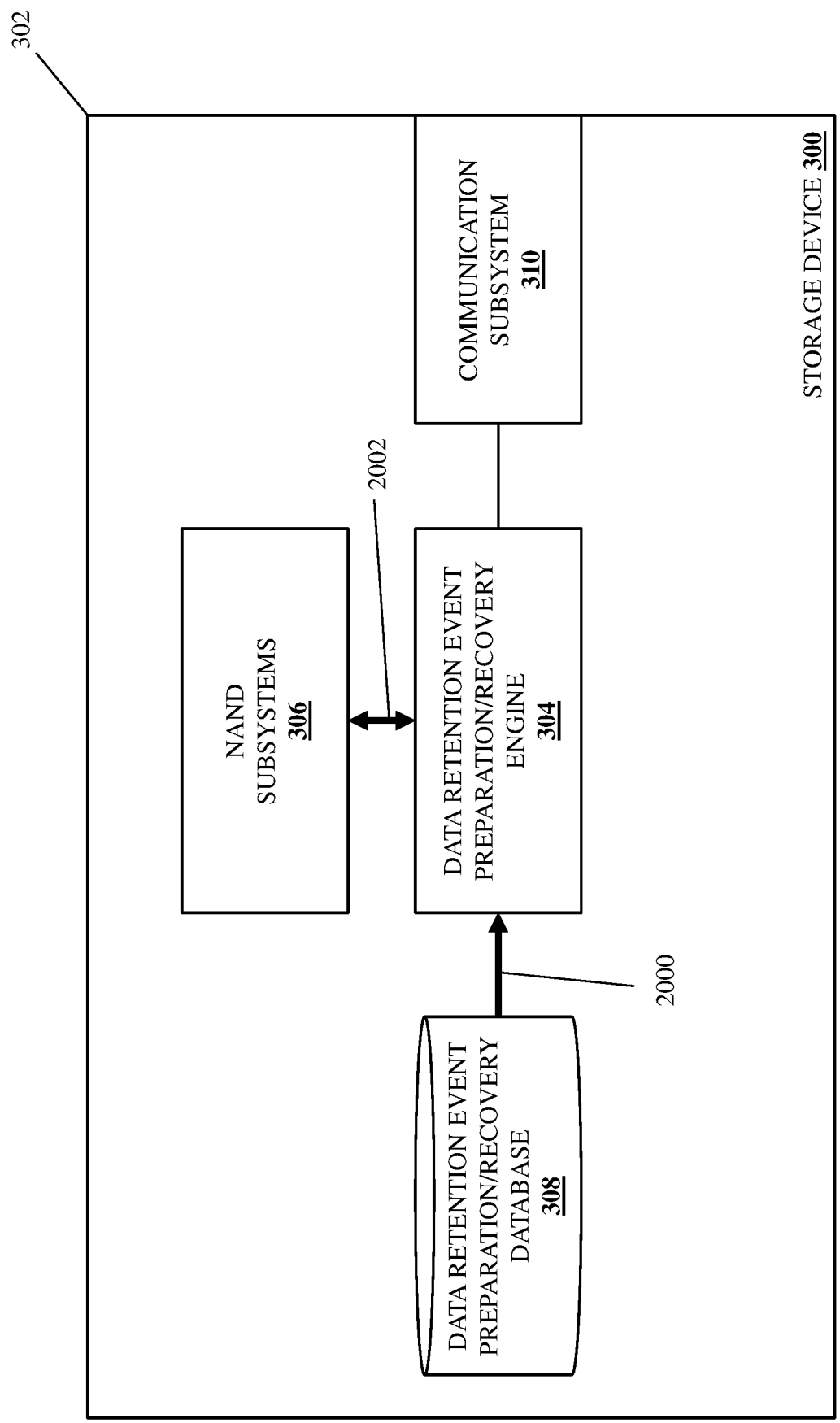
FIG. 20 is a schematic view illustrating an embodiment of the storage device of FIG. 3 operating during the method of FIG. 4.

The method 1900 begins at block 1702 where a storage device is powered on following a data retention event similarly as described above with reference to the method 1700 of FIG. 17. The method 1900 then proceeds to block 1902 where the storage device performs recovery operations on data rewritten to the NAND subsystems. With reference to FIG. 20, in some embodiments of block 1902, the data retention event preparation/recovery engine 304 in the storage device 300 may perform data recovery information retrieval operations 2000 that may include accessing the data retention event preparation/recovery database 308 to retrieve data recovery information that may be needed to perform data recovery operations. The data retention event preparation/recovery engine 304 may then perform data recovery operations 2002 that may include using the data recovery information (if needed) to perform data recovery on data stored on the NAND subsystems 306.

With reference to the method 700 of FIG. 7, the data recovery operations 2002 performed at block 1902 may include any of a variety of conventional data recovery operations known in the art, and as discussed above the rewriting of the data using the increased number of write operations reduces a voltage range of that data, thus increasing the recoverability of data stored on the NAND subsystems 306 subsequent to the data retention event, and reducing the time needed to recover that data. With reference to the method 900 of FIG. 9, the data recovery operations 2002 performed at block 1902 may include any of a variety of conventional data recovery operations known in the art, and as discussed above the data is rewritten using the data retention event rewriting voltage that is sufficient to compensate for voltage reductions that occur during the data retention event, thus increasing the recoverability of data stored on the NAND subsystems 306 subsequent to the data retention event, and reducing the time needed to recover that data.

With reference to the method 1100 of FIG. 11, the data recovery operations 2002 performed at block 1902 may include any of a variety of conventional data recovery operations known in the art, and as discussed above the rewriting of the data stored on the subset of the plurality of NAND subsystems removes the powered-on voltage modifications from that data, thus increasing the recoverability of data stored on the NAND subsystems 306 subsequent to the data retention event, and reducing the time needed to recover that data. With reference to the method 1400 of FIG. 14, the data recovery operations 2002 performed at block 1902 may include any of a variety of conventional data recovery operations known in the art, and as discussed above the filling of open blocks included in the plurality of NAND subsystems prior to the data retention event prevents unwritten cells in open blocks in the NAND subsystems from interfering with written cells in the NAND subsystem, and eliminates the need to compensate for unwritten cells in open blocks in the NAND subsystem after power up of the storage device following the data retention event. The method 1900 proceeds to block 1712 where the storage device ends data recovery following the data retention event similarly as described above with reference to the method 1700 of FIG. 17.

Thus, systems and methods have been described that provide for the preparation of NAND subsystems in a storage device for a data retention event to decrease the time needed to perform data recovery operations subsequent to the data retention event and reduce or eliminate the occurrence of unrecoverable data following the data retention event. For example, in preparation for the data prevention event, data stored in NAND subsystems that exceed error thresholds may be copied to overprovisioned blocks in the NAND subsystems, data may be rewritten to NAND subsystems with reduced voltage ranges, data may be rewritten to NAND subsystem with increased voltages, data may be rewritten to NAND subsystems to remove powered-on voltage modification associated with that data, and open blocks in NAND subsystems may be filled with dummy data and those blocks closed, and any combination (or all) of these techniques may be performed to provide for data retention event recovery improvements over conventional data retention event recovery systems known in the art.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A data retention event preparation/recovery system, comprising:
    a chassis;
    a plurality of NAND subsystems included in the chassis; and
    a data retention event preparation/recovery subsystem that is included in the chassis, coupled to the plurality of NAND subsystems, and configured to determine that the plurality of NAND subsystems will experience a data retention event that will result from a powering off of the plurality of NAND subsystems that will degrade data stored thereon and, in response:
        identify a first subset of the plurality of NAND subsystems that exceed an error threshold;
        identify at least one overprovisioned block in the plurality of NAND subsystems that has had its data erased such that it is freed up for the storage of new data;
        copy data that is stored on the first subset of the plurality of NAND subsystems to the at least one overprovisioned block in the plurality of NAND subsystems; and
        power off the plurality of NAND subsystems to begin the data retention event.

2. The system of claim 1, wherein the first subset of the plurality of NAND subsystems include at least one of a NAND block, a NAND wordline, or a NAND page.

3. The system of claim 1, wherein the data retention event preparation/recovery subsystem is configured, in response to powering on of the plurality of NAND subsystems following the powering off the plurality of NAND subsystems, to:
    attempt read operations on a first NAND subsystem included in the first subset of the plurality of NAND subsystems;
    determine that first data that is stored on the first NAND subsystem is unrecoverable; and
    read second data that is a copy of the first data and that is stored on a first overprovisioned block included in the at least one overprovisioned block in the plurality of NAND subsystems.

4. The system of claim 1, wherein the data retention event preparation/recovery subsystem is configured, in response to determining that the plurality of NAND subsystems will experience the data retention event and prior to the powering off the plurality of NAND subsystems to begin the data retention event, to:
    rewrite data that is stored on the plurality of NAND subsystems using an increased number of write operations relative to a number of write operations used in the writing of that data to the plurality of NAND subsystems, wherein the rewriting of the data using the increased number of write operations reduces a voltage range of that data.

5. The system of claim 4, wherein the data retention event preparation/recovery subsystem is configured, in response to powering on of the plurality of NAND subsystems following the powering off the plurality of NAND subsystems, to:
    perform recovery operations on a subset of the data that was rewritten to the plurality of NAND subsystems, wherein the reduced voltage range of the subset of the data that was rewritten to the plurality of NAND subsystems reduces the number of recovery operations required to recover the subset of the data that was rewritten to the plurality of NAND subsystems.

6. The system of claim 1, wherein the data retention event preparation/recovery subsystem is configured, in response to determining that the plurality of NAND subsystems will experience the data retention event and prior to the powering off the plurality of NAND subsystems to begin the data retention event, to:

determine a data retention event rewriting voltage that is greater than a writing voltage that was used to write data that is stored in the plurality of NAND subsystems and that is sufficient to compensate for voltage reductions that occur during the data retention event; and rewrite the data that is stored on the plurality of NAND subsystems using the data retention event rewriting voltage.

7. An Information Handling System (IHS), comprising:

a processing system; and a memory system that is coupled to the processing system and that includes instructions that, when executed by the processing system, cause the processing system to provide a data retention event preparation/recovery engine that is configured to determine that a plurality of NAND subsystems will experience a data retention event that will result from a powering off of the plurality of NAND subsystems that will degrade data stored thereon and, in response:

identify a first subset of the plurality of NAND subsystems that exceed an error threshold;

identify at least one overprovisioned block in the plurality of NAND subsystems that has had its data erased such that it is freed up for the storage of new data;

copy data that is stored on the first subset of the plurality of NAND subsystems to the at least one overprovisioned block in the plurality of NAND subsystems; and power off the plurality of NAND subsystems to begin the data retention event.

8. The IHS of claim 7, wherein the first subset of the plurality of NAND subsystems include at least one of a NAND block, a NAND wordline, or a NAND page.

9. The IHS of claim 7, wherein the data retention event preparation/recovery engine is configured, in response to powering on of the plurality of NAND subsystems following the powering off the plurality of NAND subsystems, to:

attempt read operations on a first NAND subsystem included in the first subset of the plurality of NAND subsystems;

determine that first data that is stored on the first NAND subsystem is unrecoverable; and read second data that is a copy of the first data and that is stored on a first overprovisioned block included in the at least one overprovisioned block in the plurality of NAND subsystems.

10. The IHS of claim 7, wherein the data retention event preparation/recovery engine is configured, in response to determining that the plurality of NAND subsystems will experience the data retention event and prior to the powering off the plurality of NAND subsystems to begin the data retention event, to:

rewrite data that is stored on the plurality of NAND subsystems using an increased number of write operations relative to a number of write operations used in the writing of that data to the plurality of NAND subsystems, wherein the rewriting of the data using the increased number of write operations reduces a voltage range of that data.

11. The IHS of claim 10, wherein the data retention event preparation/recovery engine is configured, in response to powering on of the plurality of NAND subsystems following the powering off the plurality of NAND subsystems, to:

perform recovery operations on a subset of the data that was rewritten to the plurality of NAND subsystems, wherein the reduced voltage range of the subset of the data that was rewritten to the plurality of NAND subsystems reduces a number of recovery operations required to recover the subset of the data that was rewritten to the plurality of NAND subsystems.

12. The IHS of claim 7, wherein the data retention event preparation/recovery engine is configured, in response to determining that the plurality of NAND subsystems will experience the data retention event and prior to the powering off the plurality of NAND subsystems to begin the data retention event, to:

determine a data retention event rewriting voltage that is greater than a writing voltage that was used to write data that is stored in the plurality of NAND subsystems and that is sufficient to compensate for voltage reductions that occur during the data retention event; and rewrite the data that is stored on the plurality of NAND subsystems using the data retention event rewriting voltage.

13. The IHS of claim 7, wherein the data retention event preparation/recovery engine is configured, in response to determining that the plurality of NAND subsystems will experience the data retention event and prior to the powering off the plurality of NAND subsystems to begin the data retention event, to:

identify a second subset of the plurality of NAND subsystems that have experienced powered-on voltage modifications to the data stored therein; and rewrite the data stored on the second subset of the plurality of NAND subsystems to remove the powered-on voltage modifications from that data.

14. A method for preparing for and recovering from a data retention event in a storage device, comprising:

determining, by a storage device, that a plurality of NAND subsystems in the storage device will experience a data retention event that will result from a powering off of the plurality of NAND subsystems that will degrade data stored thereon and, in response:

identifying, by the storage device, a first subset of the plurality of NAND subsystems that exceed an error threshold;

identifying, by the storage device, at least one overprovisioned block in the plurality of NAND subsystems that has had its data erased such that it is freed up for the storage of new data;

copying, by the storage device, data that is stored on the first subset of the plurality of NAND subsystems to the at least one overprovisioned block in the plurality of NAND subsystems; and powering off, by the storage device, the plurality of NAND subsystems to begin the data retention event.

15. The method of claim 14, wherein the first subset of the plurality of NAND subsystems include at least one of a NAND block, a NAND wordline, or a NAND page.

16. The method of claim 14, wherein the method further includes, in response to powering on of the plurality of NAND subsystems following the powering off the plurality of NAND subsystems:

attempting, by the storage device, read operations on a first NAND subsystem included in the first subset of the plurality of NAND subsystems;

determining, by the storage device, that first data that is stored on the first NAND subsystem is unrecoverable; and reading, by the storage device, second data that is a copy of the first data and that is stored on a first overprovisioned block included in the at least one overprovisioned block in the plurality of NAND subsystems.

17. The method of claim 16, wherein the method further includes, in response to determining that the plurality of NAND subsystems will experience the data retention event and prior to the powering off the plurality of NAND subsystems to begin the data retention event:

rewriting, by the storage device, data that is stored on the plurality of NAND subsystems using an increased number of write operations relative to a number of write operations used in the writing of that data to the plurality of NAND subsystems, wherein the rewriting of the data using the increased number of write operations reduces a voltage range of that data.

18. The method of claim 17, wherein the method further includes, in response to powering on of the plurality of NAND subsystems following the powering off the plurality of NAND subsystems:

performing, by the storage device, recovery operations on a subset of the data that was rewritten to the plurality of NAND subsystems, wherein the reduced voltage range of the subset of the data that was rewritten to the plurality of NAND subsystems reduces a number of recovery operations required to recover the subset of the data that was rewritten to the plurality of NAND subsystems.

19. The method of claim 14, wherein the method further includes, in response to determining that the plurality of NAND subsystems will experience the data retention event and prior to the powering off the plurality of NAND subsystems to begin the data retention event:

determining, by the storage device, a data retention event rewriting voltage that is greater than a writing voltage that was used to write data that is stored in the plurality of NAND subsystems and that is sufficient to compensate for voltage reductions that occur during the data retention event; and rewriting, by the storage device, the data that is stored on the plurality of NAND subsystems using the data retention event rewriting voltage.

20. The method of claim 14, wherein the method further includes, in response to determining that the plurality of NAND subsystems will experience the data retention event and prior to the powering off the plurality of NAND subsystems to begin the data retention event:

identifying, by the storage device, a second subset of the plurality of NAND subsystems that have experienced powered-on voltage modifications to the data stored therein; and rewrite, by the storage device, the data stored on the second subset of the plurality of NAND subsystems to remove the powered-on voltage modifications from that data.

\* \* \* \* \*